United States Patent
Masuo et al.

(10) Patent No.: US 8,125,820 B2
(45) Date of Patent: Feb. 28, 2012

(54) SEMICONDUCTOR MEMORY DEVICE

(75) Inventors: Akira Masuo, Hyogo (JP); Yasuhiro Agata, Osaka (JP)

(73) Assignee: Panasonic Corporation, Osaka (JP)

( * ) Notice: Subject to any disclaimer, the term of this patent is extended or adjusted under 35 U.S.C. 154(b) by 14 days.

(21) Appl. No.: 12/880,608

(22) Filed: Sep. 13, 2010

(65) Prior Publication Data

US 2010/0328991 A1 Dec. 30, 2010

Related U.S. Application Data

(63) Continuation of application No. PCT/JP2010/000643, filed on Feb. 3, 2010.

(30) Foreign Application Priority Data

Feb. 12, 2009 (JP) ................. 2009-030146

(51) Int. Cl.
*G11C 11/00* (2006.01)
(52) U.S. Cl. .................. 365/156; 365/230.03
(58) Field of Classification Search .................. 365/156, 365/230.03
See application file for complete search history.

(56) References Cited

U.S. PATENT DOCUMENTS

| 7,027,334 B2 * | 4/2006 | Ikehashi et al. .......... 365/189.07 |
| 2003/0206448 A1 | 11/2003 | Sung et al. |
| 2007/0139230 A1 | 6/2007 | Masuo et al. |

FOREIGN PATENT DOCUMENTS

| JP | 61-162893 | 7/1986 |
| JP | 05-089682 | 4/1993 |
| JP | 06-068672 | 3/1994 |
| JP | 11-007775 | 1/1999 |
| JP | 2003-331582 | 11/2003 |
| JP | 2007-164922 | 6/2007 |

OTHER PUBLICATIONS

Khellah, M., et al., "Wordline & Bitline Pulsing Schemes for Improving SRAM Cell Stability in Low-Vcc 65 nm CMOS Designs", Symposium on VLSI Circuits Digest of Technical Papers, 2006, IEEE.

* cited by examiner

*Primary Examiner* — Michael Tran
(74) *Attorney, Agent, or Firm* — McDermott Will & Emery LLP

(57) ABSTRACT

A memory to which a bit line potential step-down technique is applied is provided. The memory includes an IO block including first transistors which control potentials of first bit lines provided with respect to columns of memory cells, and first logic gates which control the first transistors. The drain or source of each first transistor is connected to an input of the corresponding first logic gate, and the gate of each first transistor is connected to an output of the corresponding first logic gate. The first transistors are driven by pulses.

28 Claims, 34 Drawing Sheets

DIFFUSION LAYER 100   FIRST INTERCONNECT LAYER 102
GATE ELECTRODE 101    SECOND INTERCONNECT LAYER 103

SEMICONDUCTOR MEMORY DEVICE

CROSS-REFERENCE TO RELATED APPLICATIONS

This is a continuation of PCT International Application PCT/JP2010/000643 filed on Feb. 3, 2010, which claims priority to Japanese Patent Application No. 2009-030146 filed on Feb. 12, 2009. The disclosures of these applications including the specifications, the drawings, and the claims are hereby incorporated by reference in their entirety.

BACKGROUND

The present disclosure relates to semiconductor memory devices, and more particularly, to techniques of controlling the potential of a bit line in a memory circuit.

Conventionally, there is a known technique of stepping down the potential of a bit line by driving an N-channel MOS (NMOS) transistor connected to the bit line using a pulse in order to improve the static noise margin (SNM) of a memory cell in a static random access memory (SRAM). Note that data is read out using a sense amplifier which detects a minute potential difference between a pair of bit lines (see M. Khellah et al., "Wordline & Bitline Pulsing Schemes for Improving SRAM Cell Stability in Low-Vcc 65 nm CMOS Designs," 2006 Symposium on VLSI Circuits, Digest of Technical Papers, pp. 12-13).

There is also a known technique of controlling the potential level of a signal line in a decoder circuit to drive a word line in a semiconductor memory device (see Japanese Patent Publication No. 2007-164922).

SUMMARY

In the aforementioned conventional bit line potential step-down technique, the potential of a bit line is highly likely to be excessively stepped down. When the bit line potential is excessively stepped down during read operation, a memory cell is erroneously written, so that data is corrupted. Moreover, because the NMOS transistor is connected to a bit line in order to step down the bit line, the possibility that the bit line potential is excessively stepped down is increased as the drive capability of the NMOS transistor is increased due to variations. Moreover, because a pulse signal for controlling the NMOS transistor is externally input through an IO block, the pulse signal is deformed, so that the pulse width changes or the like, which may be responsible for the bit line potential being excessively stepped down.

Moreover, in the aforementioned conventional bit line potential step-down technique, the stepped-down bit line potential reduces the drive capability of an access transistor in the SRAM memory cell, so that it takes a long time for the potential difference between a pair of bit lines to reach a predetermined value. Therefore, the SNM is improved, but the speed is reduced, which is a problem.

Moreover, in the aforementioned conventional word line drive technique, the amplitude of the potential of the decoder circuit is reduced, thereby increasing the speed and reducing the power. However, in the NMOS transistor, it takes a long time (precharge time) to increase the potential of a signal line to Vdd−Vtn where Vdd is the voltage of a power supply and Vtn is the threshold voltage of the NMOS transistor.

The detailed description describes implementations of a bit line potential control for semiconductor memory devices in which a potential control technique resistant to variations is used to reduce or prevent erroneous operation, such as erroneous write operation and the like, and improve the SNM, thereby achieving stable operation.

The detailed description also describes implementations of higher speed operation using a technique of allowing read operation using a low amplitude by stepping down the bit line potential.

A first example semiconductor memory device according to the present disclosure includes a memory array block including a plurality of memory cells arranged in a matrix, a plurality of bit lines including first bit lines provided with respect to columns of the memory cells, a plurality of first transistors configured to control potentials of the first bit lines, and a plurality of first logic gates configured to control the first transistors. A drain or a source of each of the first transistors is connected to an input of the corresponding first logic gate, and a gate of each of the first transistors is connected to an output of the corresponding first logic gate.

A second example semiconductor memory device according to the present disclosure includes a memory array block including a plurality of memory cells arranged in a matrix, a plurality of bit lines including first bit lines provided with respect to columns of the memory cells, a plurality of first transistors configured to control potentials of the first bit lines, a plurality of first capacitors each including two electrodes, one of the two electrodes being connected to the corresponding bit line, and a plurality of first logic gates configured to control the first capacitors. A gate of each of the first transistors is connected to an input of the corresponding first logic gate, and the other electrode of each of the first capacitors is connected to an output of the corresponding first logic gate.

As described above, the bit line potential may be stepped down via the first transistor. In this case, a signal is supplied via the same connect node to the drain or source of the first transistor and the input of the first logic gate, whereby the bit line potential is not excessively stepped down. Moreover, the bit line potential may be stepped down via the first capacitor. In this case, a signal is supplied via the same connect node to the drain or source of the first transistor and the input of the first logic gate, whereby the bit line potential is not excessively stepped down.

As a result, the bit line potential is not excessively stepped down, and therefore, erroneous operation, such as erroneous write operation and the like, can be reduced or prevented. At the same time, an improvement in the SNM which is ultimately intended by stepping down the bit line potential can be achieved.

A third example semiconductor memory device according to the present disclosure includes a memory array block including a plurality of memory cells arranged in a matrix, a plurality of bit lines including first bit lines provided with respect to columns of the memory cells, and a plurality of word lines including first word lines provided with respect to rows of the memory cells, an IO block connected to the first bit lines, a decoder block connected to the first word lines, and a control block provided adjacent to both the IO block and the decoder block. The decoder block includes a plurality of word drivers each including a first N-channel MOS transistor having a source connected to a first common node. The control block includes a second N-channel MOS transistor having a drain connected to the first common node, a first transistor configured to control a potential of the first common node, and a first logic gate configured to control the first transistor. A drain or a source of the first transistor is connected to an input of the first logic gate, and a gate of the first transistor is connected to an output of the first logic gate.

According to the present disclosure, the semiconductor memory device can perform stable operation by improving the SNM while reducing or preventing erroneous operation, such as erroneous write operation or the like. Moreover, read operation with a small amplitude is achieved by stepping down the bit line potential, resulting in higher-speed operation.

Higher-speed and higher-frequency operation can also be achieved by stepping down the potential of a signal line of a decoder circuit.

DETAILED DESCRIPTION

Figure 1:
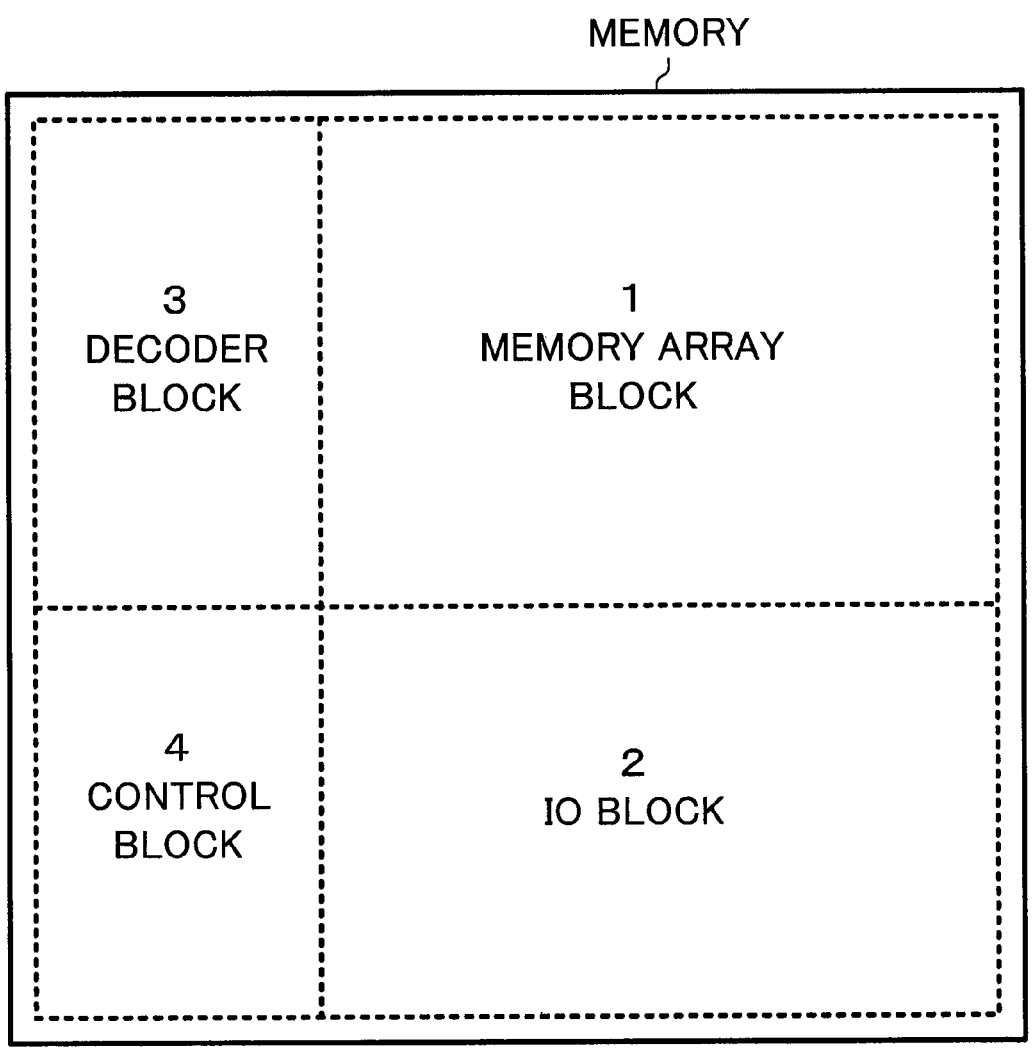
FIG. 1 shows an example configuration of an SRAM block which is a semiconductor memory device according to an embodiment of the present disclosure.

Embodiments of the present disclosure will be described in detail hereinafter with reference to the accompanying drawings. Note that like parts in IO blocks are indicated by like reference characters.

FIG. 1 shows an example configuration of an SRAM block which is a semiconductor memory device according to an embodiment of the present disclosure. The SRAM block of FIG. 1 includes a memory array block 1 including a plurality of memory cells arranged in a matrix, an IO block 2 provided with respect to columns of the memory array block 1, a decoder block 3 provided with respect to rows of the memory array block 1, and a control block 4 provided adjacent to both the IO block 2 and the decoder block 3.

Figure 2:
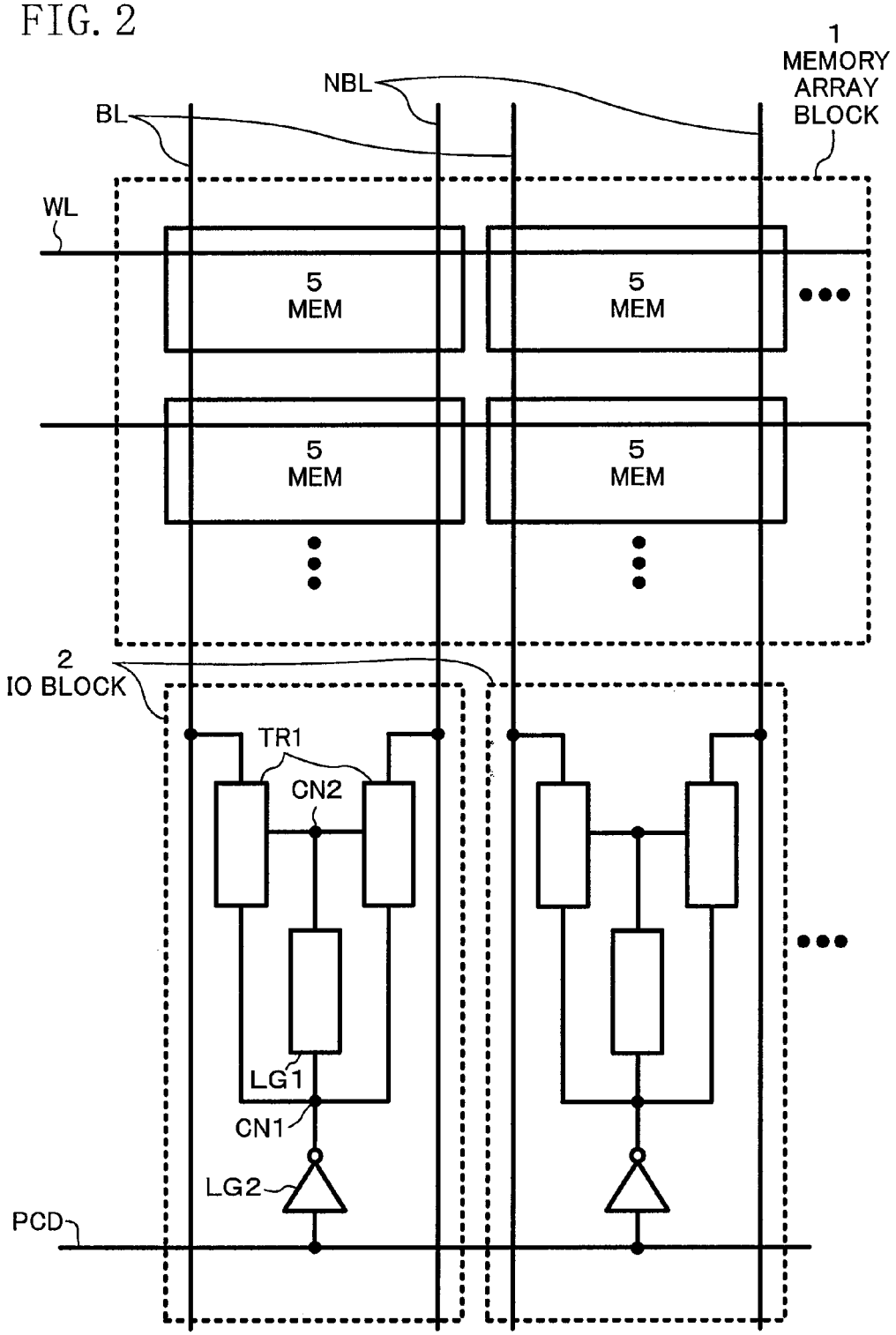
FIG. 2 is a block diagram showing details of a memory array block and an IO block of FIG. 1.

FIG. 2 shows details of the memory array block 1 and the IO block 2 of FIG. 1. In FIG. 2, the memory array block 1 includes a plurality of memory cells (MEM) 5 arranged in a matrix, a plurality of bit lines including first bit lines BL and NBL provided with respect to columns of the memory cells 5, a plurality of word lines including first word lines WL provided with respect to rows of the memory cells 5. The IO block 2 is connected to the bit lines including the first bit lines BL and NBL provided with respect to the columns of the memory cells 5. The IO block 2 includes first transistors TR1, a first logic gate LG1, and a second logic gate LG2. The first transistors TR1 control the potentials of the first bit lines BL and NBL, and the first logic gate LG1 controls the first transistors TR1. A signal is supplied through a first connect node CN1 to the drain or source of each first transistor TR1 and an input of the first logic gate LG1. An output of the first logic gate LG1 is connected via a second connect node CN2 to the gates of the first transistors TR1. The second logic gate LG2 which supplies a signal to the first connect node CN1 is provided inside the IO block 2. The second logic gate LG2 receives a precharge and potential control signal PCD.

With this configuration, timings are generated from the first connect node CN1 in the IO block 2, resulting in smaller variations in the decrease in the bit line potential. As a result, it is possible to reduce or prevent erroneous operation caused by an excessive decrease in the potential. Moreover, because the logic gate LG2 which supplies a signal to the first connect node CN1 is provided inside the IO block 2, a timing deviation caused by waveform deformation at the first connect node CN1 can be reduced.

Figure 3:
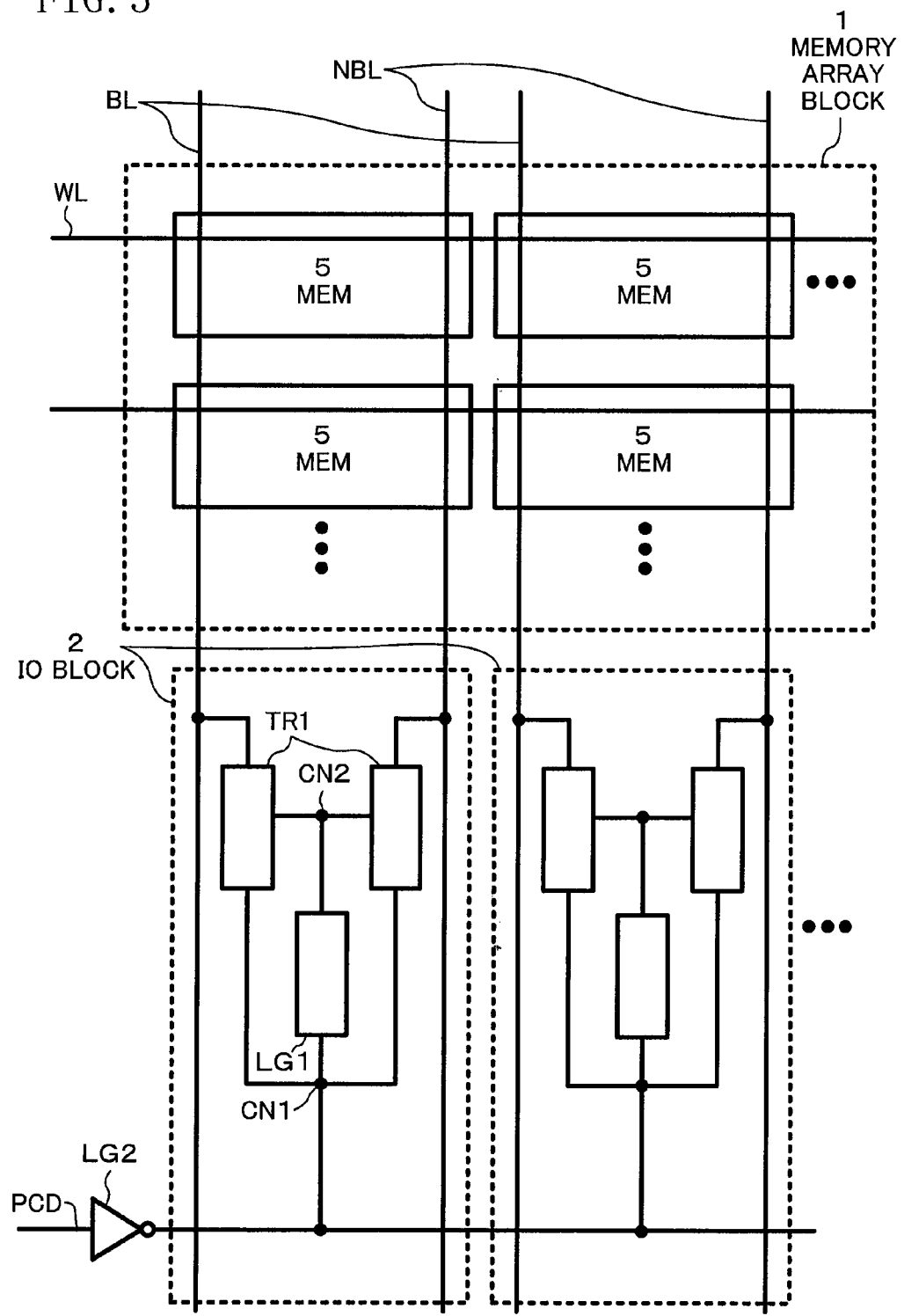
FIG. 3 is a block diagram showing other details of the memory array block and the IO block of FIG. 1.

In FIG. 3, the logic gate LG2 which supplies a signal to the first connect node CN1 is provided in the control block 4 outside the IO block 2. This configuration can reduce the number of elements in the IO block 2, resulting in a smaller area.

Figure 4:
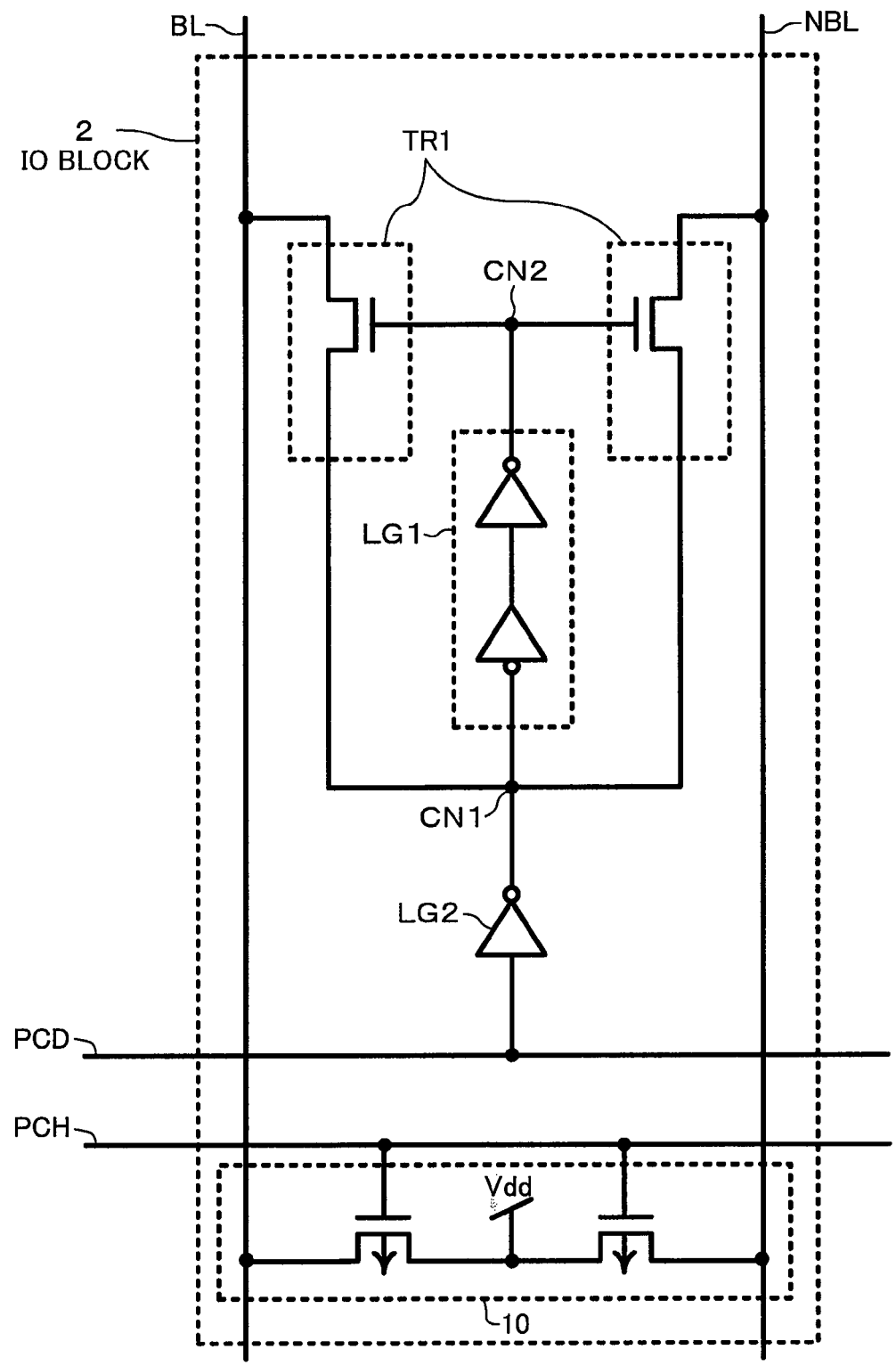
FIG. 4 is a circuit diagram showing a first example detailed configuration of the IO block of FIG. 2.

FIG. 4 shows a first example detailed configuration of the IO block 2 of FIG. 2. Each first transistor TR1 includes an N-channel MOS (NMOS) transistor. The first logic gate LG1 includes two inverters connected in cascade. A precharge circuit 10 is connected to the first bit lines BL and NBL. The precharge circuit 10 is controlled in accordance with a precharge signal PCH.

Figure 5:
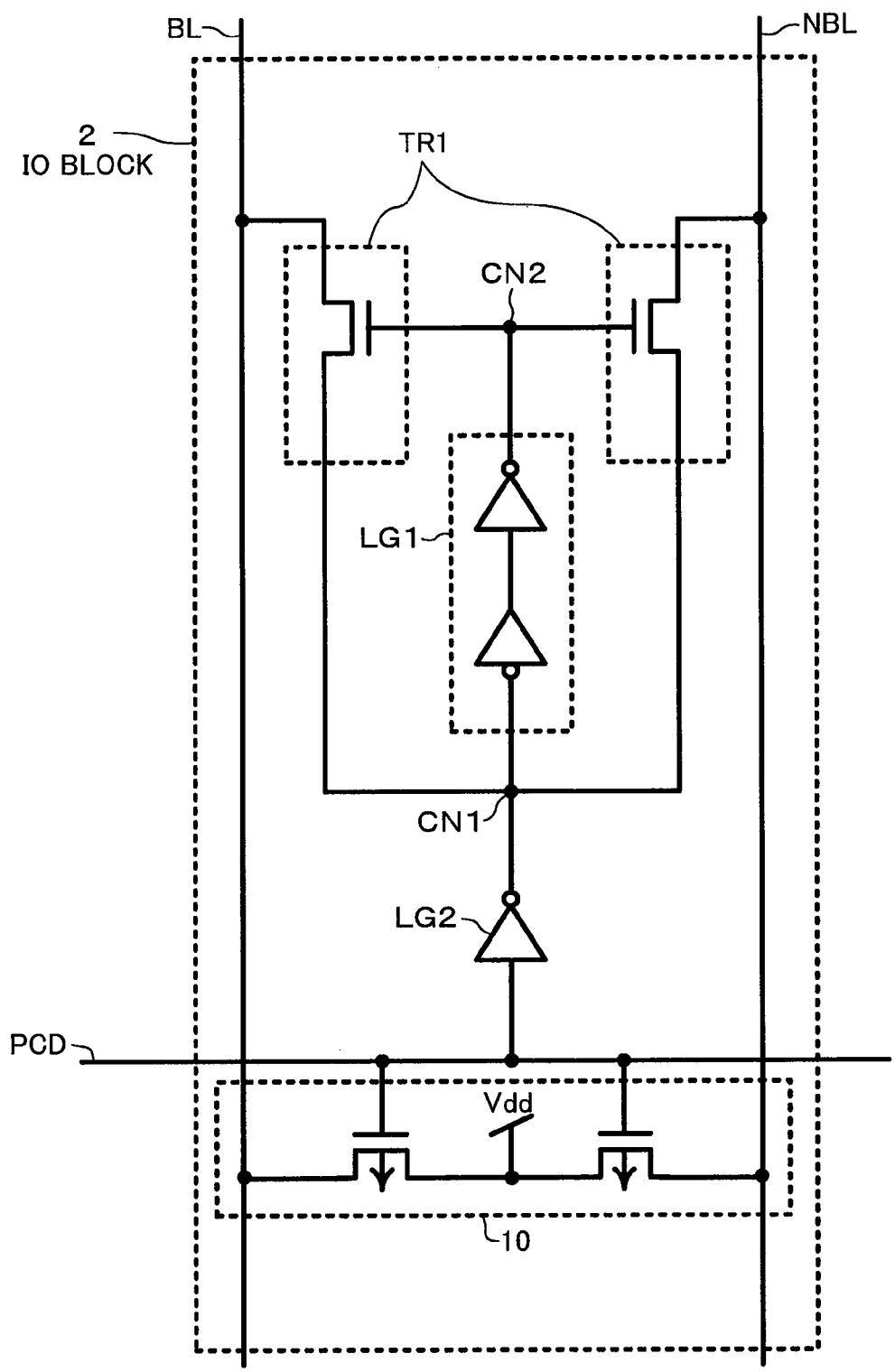
FIG. 5 is a circuit diagram showing a second example detailed configuration of the IO block of FIG. 2.

FIG. 5 shows a second example detailed configuration of the IO block 2 of FIG. 2. The precharge signal PCH of FIG. 4 is also used as a precharge and potential control signal PCD. With this configuration, an interconnect dedicated to a precharge signal is not required, so that interconnect resources can be more easily ensured.

Figure 6:
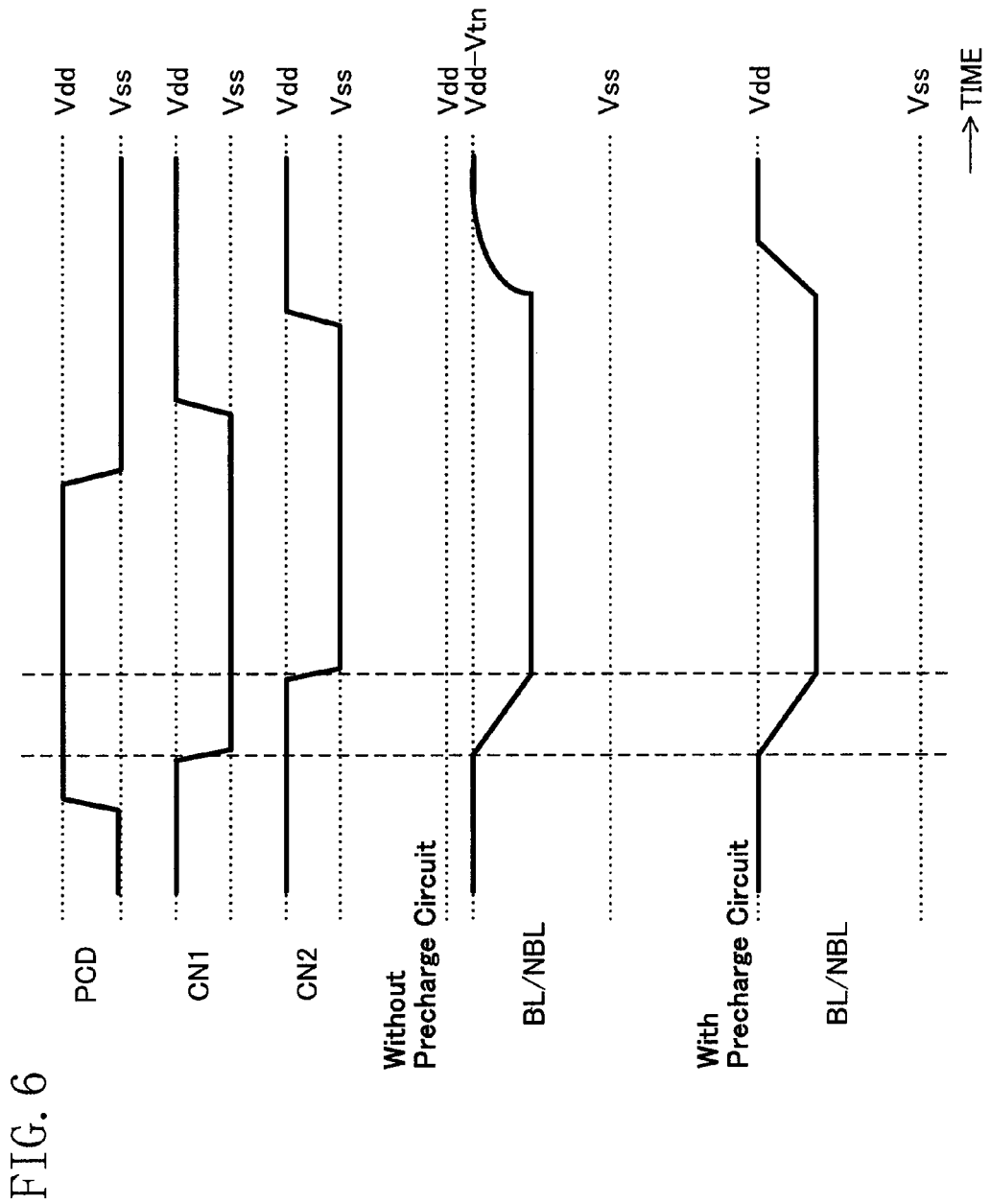
FIG. 6 is a diagram showing timings of FIGS. 4 and 5.

FIG. 6 shows timings of FIGS. 4 and 5. Here, three states will be described.

(i) When the signal PCD is at the "L" level, the first connect node CN1 is at the "H" level and the second connect node CN2 is at the "H" level, so that the first transistors TR1 are turned on, and the "H" level of the first connect node CN1 is propagated to the first bit lines BL and NBL. As a result, the first bit lines BL and NBL are precharged to the "H" level.

(ii) When the signal PCD is at the "H" level, the first connect node CN1 is at the "L" level, and the second connect node CN2 is at the "H" level, the first transistors TR1 are turned on, and the "L" level of the first connect node CN1 is propagated to the first bit lines BL and NBL. As a result, the potentials of the first bit lines BL and NBL are stepped down to the "L" level.

(iii) When the signal PCD is at the "H" level, the first connect node CN1 is at the "L" level, and the second connect node CN2 is at the "L" level, the first transistors TR1 are turned off. As a result, the first bit lines BL and NBL are transitioned to a potential which is slightly lower than the "H" level (floating state).

Here, it is assumed that the precharge circuit 10 of FIG. 4 or 5 is not provided. In the aforementioned condition (i), the precharge potential is Vdd−Vtn because the first transistors TR1 each include an NMOS transistor. In (ii), the potentials of the first bit lines BL and NBL can be quickly stepped down because the first transistors TR1 each include an NMOS transistor. In (iii), the potentials of the first bit lines BL and NBL are stepped down for a delay time corresponding to the first logic gate LG1 before the first transistors TR1 are turned off, so that the first bit lines BL and NBL are transitioned to the floating state.

Here, it is assumed that the precharge circuit 10 of FIG. 4 or 5 is provided. In the aforementioned condition (i), the precharge circuit 10 can cause the precharge potential to increase to Vdd and, at the same time, can quickly performs precharge.

Figure 7:
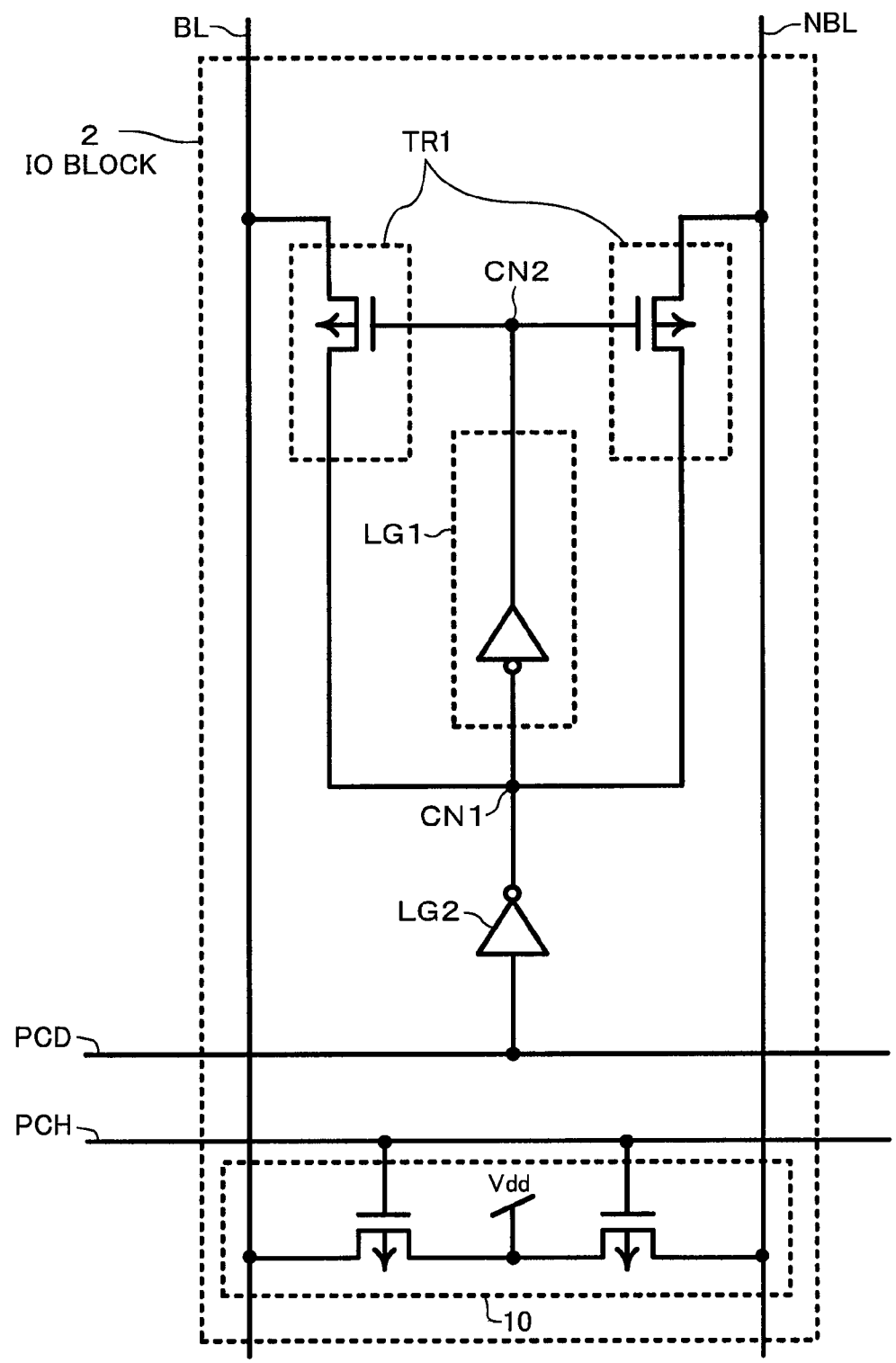
FIG. 7 is a circuit diagram showing a third example detailed configuration of the IO block of FIG. 2.

FIG. 7 shows a third example detailed configuration of the IO block 2 of FIG. 2. The first transistors TR1 each include a P-channel MOS (PMOS) transistor, and the first logic gate LG1 includes a single inverter. A precharge circuit 10 is connected to the first bit lines BL and NBL. The precharge circuit 10 is controlled in accordance with a precharge signal PCH.

Figure 8:
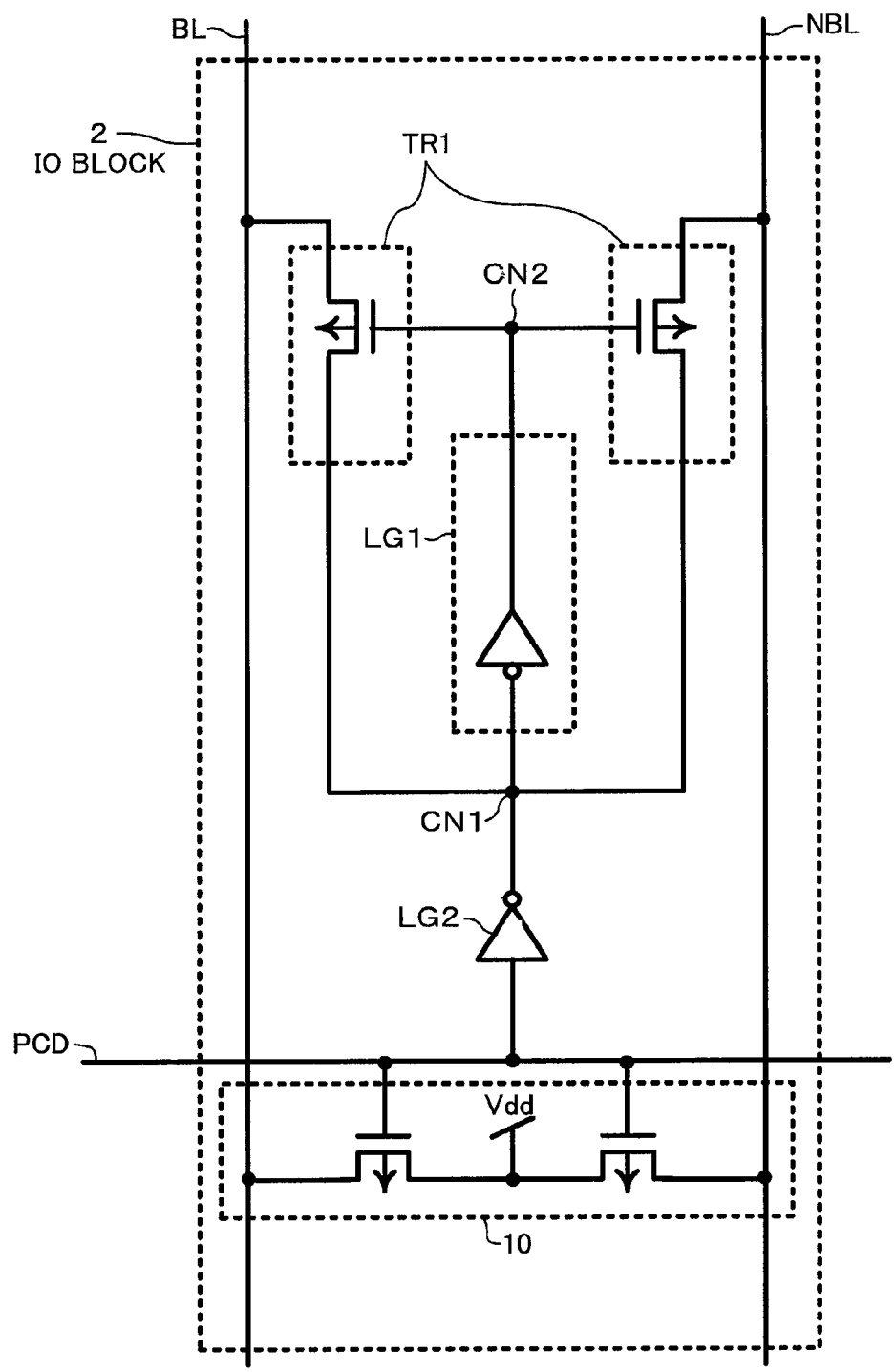
FIG. 8 is a circuit diagram showing a fourth example detailed configuration of the IO block of FIG. 2.

FIG. 8 shows a fourth example detailed configuration of the IO block 2 of FIG. 2. The precharge signal PCH of FIG. 7 is also used as a precharge and potential control signal PCD. With this configuration, an interconnect dedicated to a precharge signal is not required, so that interconnect resources can be more easily ensured.

Figure 9:
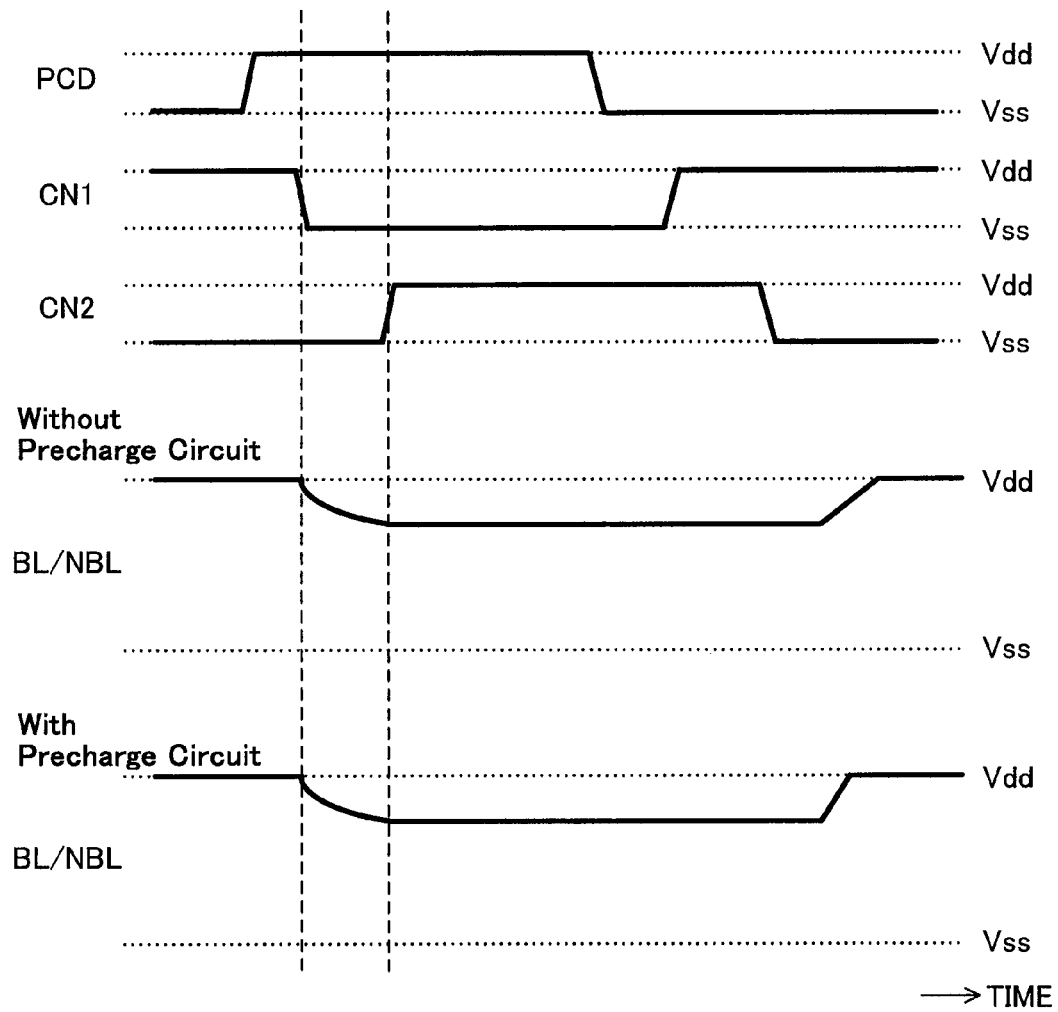
FIG. 9 is a diagram showing timings of FIGS. 7 and 8.

FIG. 9 shows timings of FIGS. 7 and 8. Here, three states will be described.

(i) When the signal PCD is at the "L" level, the first connect node CN1 is at the "H" level and the second connect node CN2 is at the "L" level, so that the first transistors TR1 are turned on, and the "H" level of the first connect node CN1 is propagated to the first bit lines BL and NBL. As a result, the first bit lines BL and NBL are precharged to the "H" level.

(ii) When the signal PCD is at the "H" level, the first connect node CN1 is at the "L" level, and the second connect node CN2 is at the "L" level, the first transistors TR1 are turned on, and the "L" level of the first connect node CN1 is propagated to the first bit lines BL and NBL. As a result, the potentials of the first bit lines BL and NBL are stepped down to the "L" level.

(iii) When the signal PCD is at the "H" level, the first connect node CN1 is at the "L" level, and the second connect node CN2 is at the "H" level, the first transistors TR1 are turned off. As a result, the first bit lines BL and NBL are transitioned to a potential which is slightly lower than the "H" level (floating state).

Here, it is assumed that the precharge circuit 10 of FIG. 7 or 8 is not provided. In the aforementioned condition (i), the precharge potential is Vdd because the first transistors TR1 each include a PMOS transistor. Because the transistors which control the precharge potential are connected via two stages to the first bit lines BL and NBL, the precharge speed is reduced. In (ii), because the first transistors TR1 each include a PMOS transistor, it is possible to reduce or prevent erroneous operation caused by an excessive decrease in the potentials of the first bit lines BL and NBL. In (iii), the potentials of the first bit lines BL and NBL are stepped down for a delay time corresponding to the first logic gate LG1 before the first transistors TR1 are turned off, so that the first bit lines BL and NBL are transitioned to the floating state.

Here, it is assumed that the precharge circuit 10 of FIG. 7 or 8 is provided. In the aforementioned condition (i), the precharge circuit 10 can quickly performs precharge.

Figure 10:
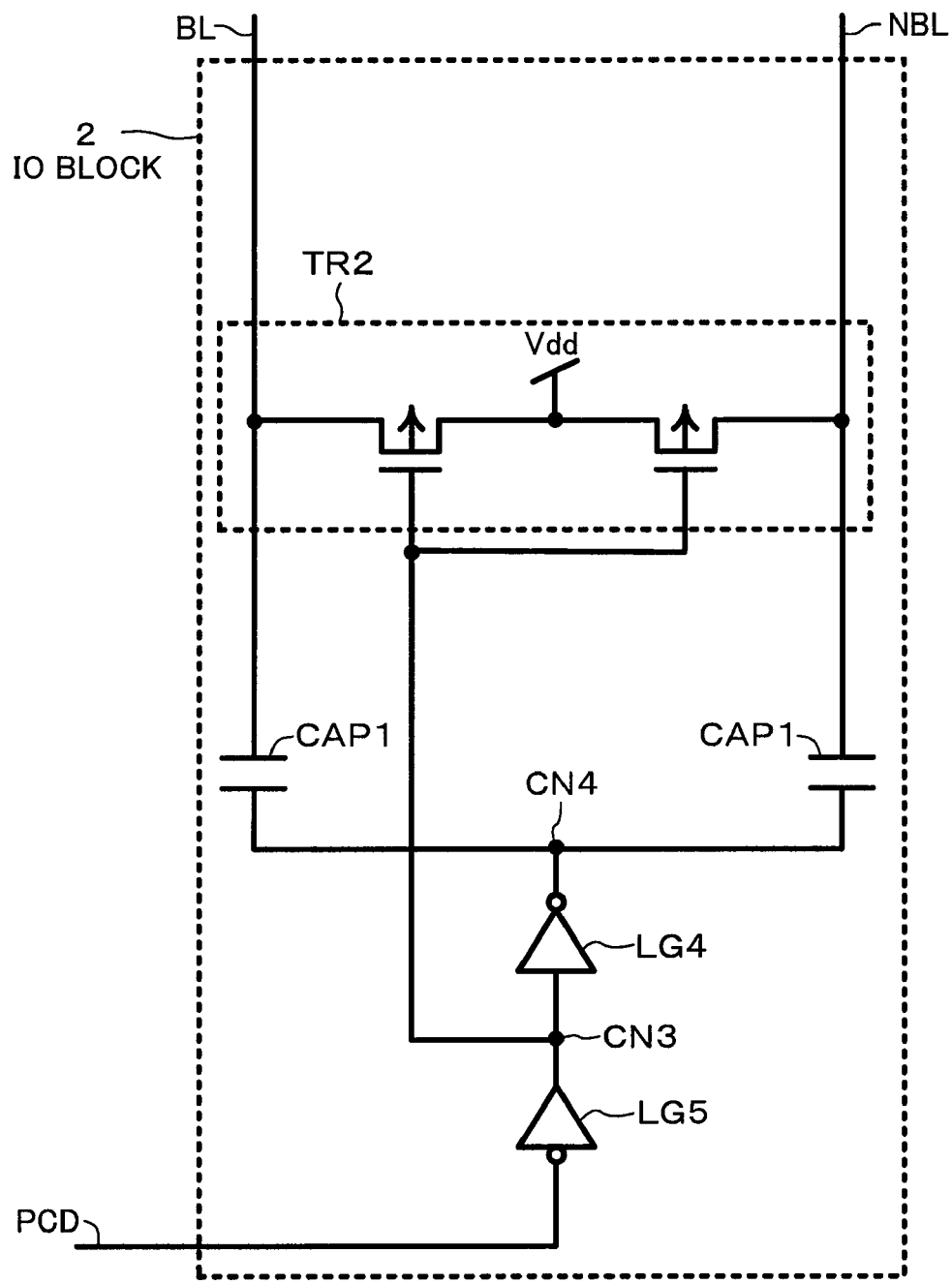
FIG. 10 is a circuit diagram showing a fifth example detailed configuration of the IO block of FIG. 2.

FIG. 10 shows a fifth example detailed configuration of the IO block 2 of FIG. 2. In FIG. 10, second transistors TR2 control the potentials of the first bit lines BL and NBL. First capacitors CAP1 are connected to the first bit lines BL and NBL. A fourth logic gate LG4 controls the first capacitors CAP1. A signal is supplied through a third connect node CN3 to inputs of the second transistors TR2 and the fourth logic gate LG4. An output of the fourth logic gate LG4 is connected via a fourth connect node CN4 to the first capacitors CAP1. A fifth logic gate LG5 which supplies a signal to the third connect node CN3 is provided inside the IO block 2. Note that the fifth logic gate LG5 may be provided outside the IO block 2.

In this configuration, the first capacitor CAP1 are used, and therefore, there is no dependence of transistor variations, particularly the threshold voltage Vt, whereby variations in the decrease in the potentials of the first bit lines BL and NBL can be reduced or prevented.

Figure 11:
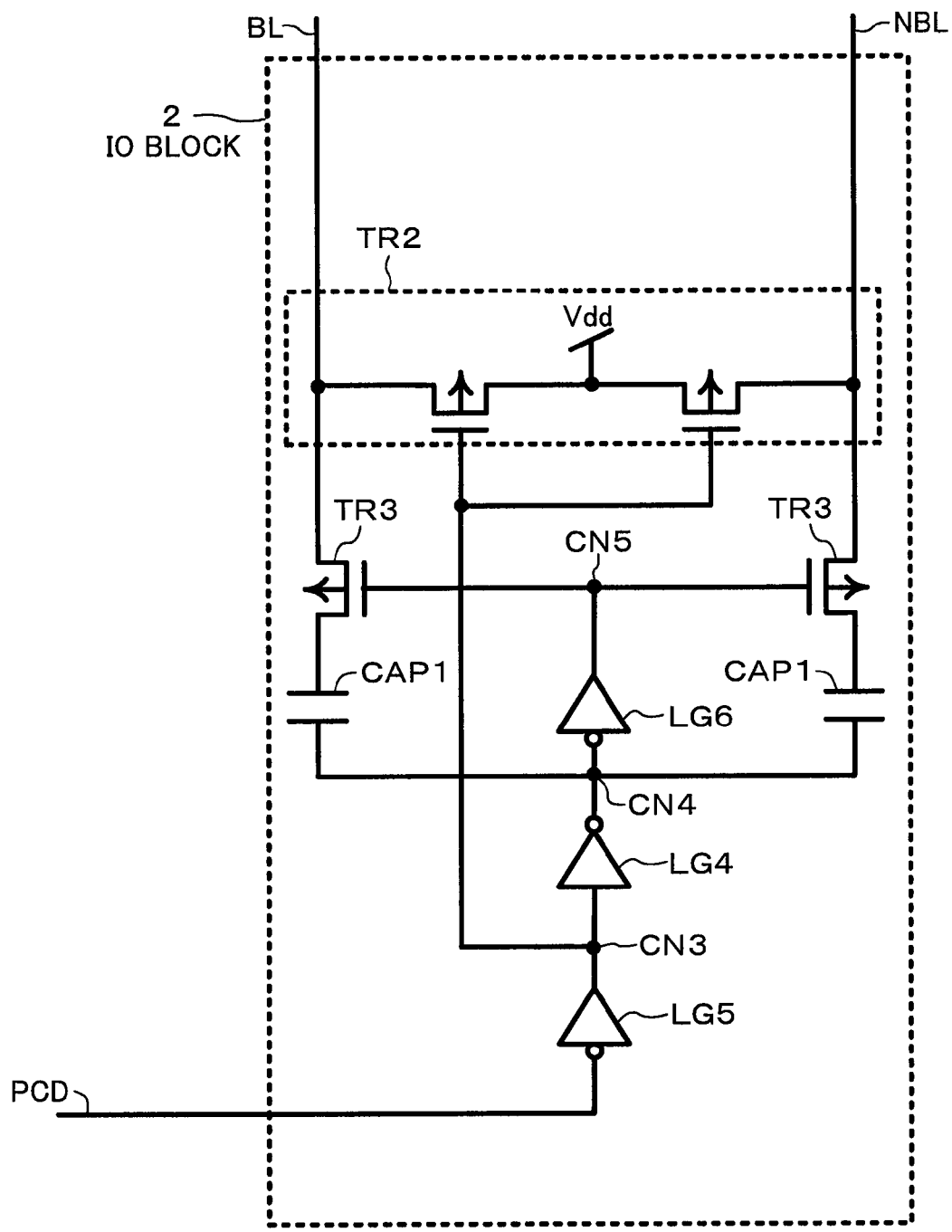
FIG. 11 is a circuit diagram showing a sixth example detailed configuration of the IO block of FIG. 2.

FIG. 11 shows a sixth example detailed configuration of the IO block 2 of FIG. 2. In addition to the configuration of FIG. 10, third transistors TR3 are interposed between the first bit lines BL and NBL and the first capacitors CAP1. A sixth logic gate LG6 controls the third transistors TR3 via a fifth connect node CN5. The fourth logic gate LG4 controls the sixth logic gate LG6 and the first capacitors CAP1.

With this configuration, during read operation, the third transistors TR3 are turned off, so that the capacitances of the first capacitors CAP1 are not connected to the first bit lines BL and NBL, resulting in higher-speed operation than that of FIG. 10.

Figure 12:
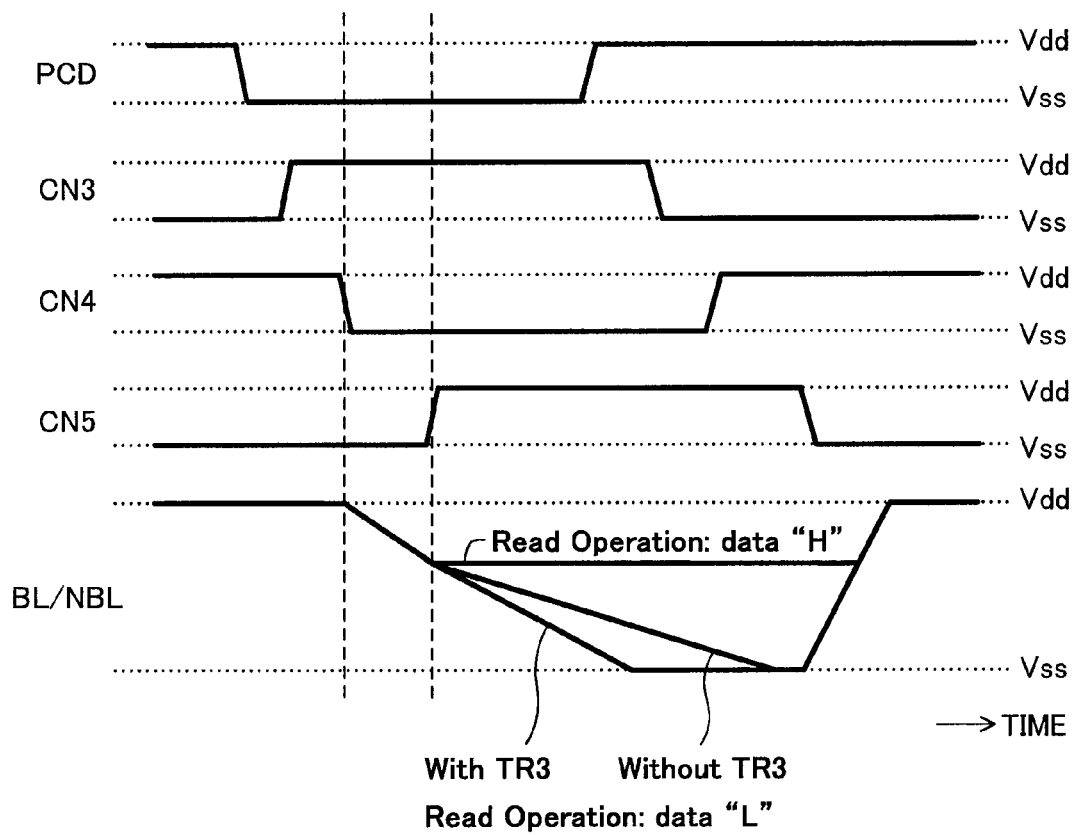
FIG. 12 is a diagram showing timings of FIG. 11.

FIG. 12 shows timings of FIG. 11. Here, three states will be described.

(i) When the signal PCD is at the "H" level, the third connect node CN3 is at the "L" level, so that the second transistors TR2 are turned on. As a result, the first bit lines BL and NBL are precharged to the "H" level.

(ii) When the signal PCD is at the "L" level, the third connect node CN3 is at the "H" level, and the fourth connect node CN4 is at the "L" level, the second transistors TR2 are turned off, and the "L" level of the fourth connect node CN4 is propagated via the first capacitors CAP1 to the first bit lines BL and NBL. As a result, the potentials of the first bit lines BL and NBL are stepped down to the "L" level.

(iii) When the signal PCD is at the "L" level, the third connect node CN3 is at the "H" level, the fourth connect node CN4 is at the "L" level, and the fifth connect node CN5 is at the "H" level, the second transistors TR2 are turned off and the third transistors TR3 are also turned off. As a result, the first bit lines BL and NBL are transitioned to a potential which is slightly lower than the "H" level (floating state).

In the aforementioned condition (ii), the first capacitors CAP1 are used to step down the first bit lines BL and NBL. Therefore, there is no dependence of transistor variations, particularly the threshold voltage Vt, whereby variations in the decrease in the potentials of the first bit lines BL and NBL can be reduced or prevented. In (iii), the third transistors TR3 are turned off, so that the capacitances of the first capacitors CAP1 are not connected to the first bit lines BL and NBL, whereby high-speed operation can be achieved without increasing the bit line capacitance.

Figure 13:
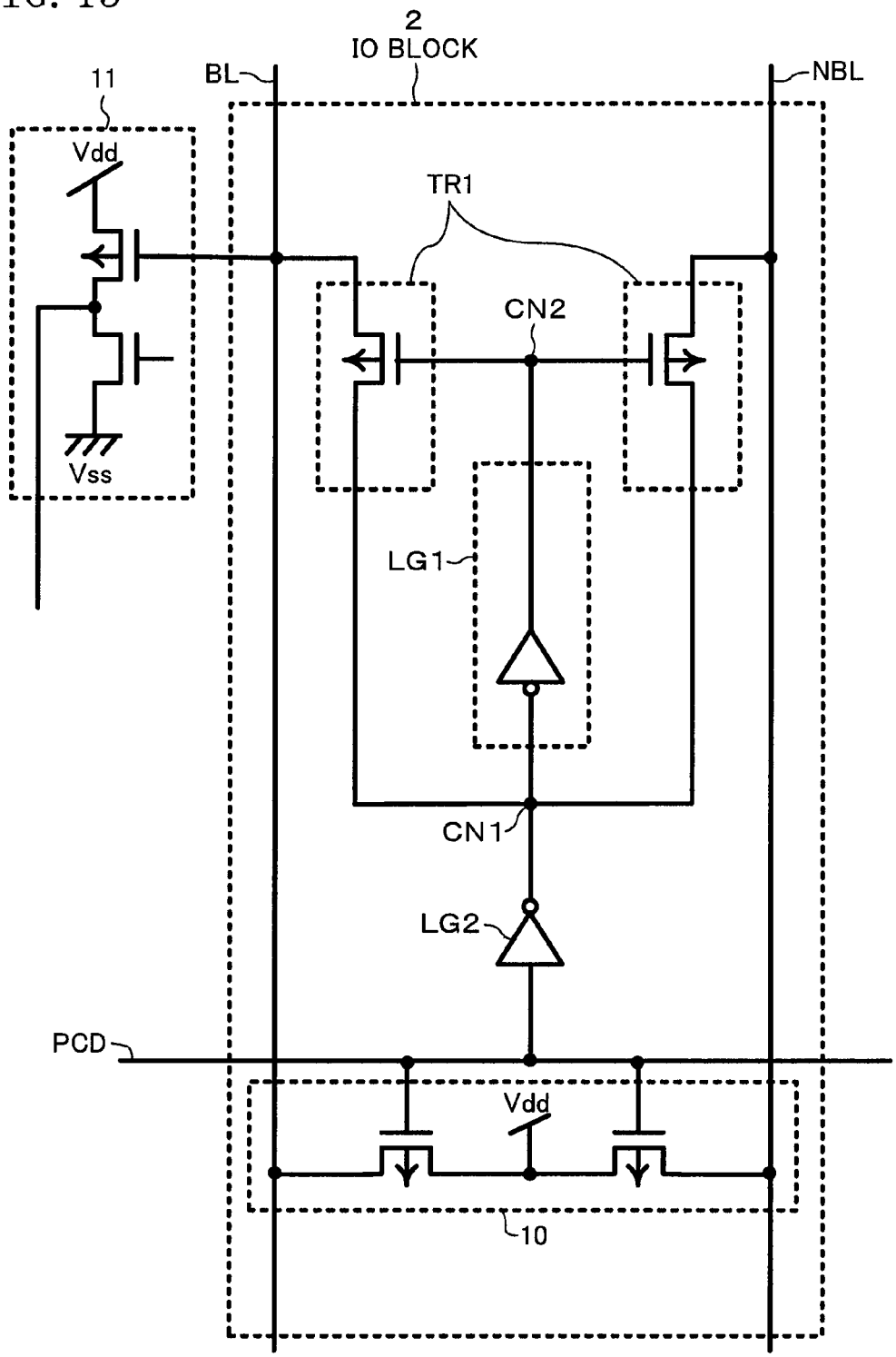
FIG. 13 is a circuit diagram showing the configuration of FIG. 8 in which a data read circuit is connected to only one of two bit lines.
Figure 14:
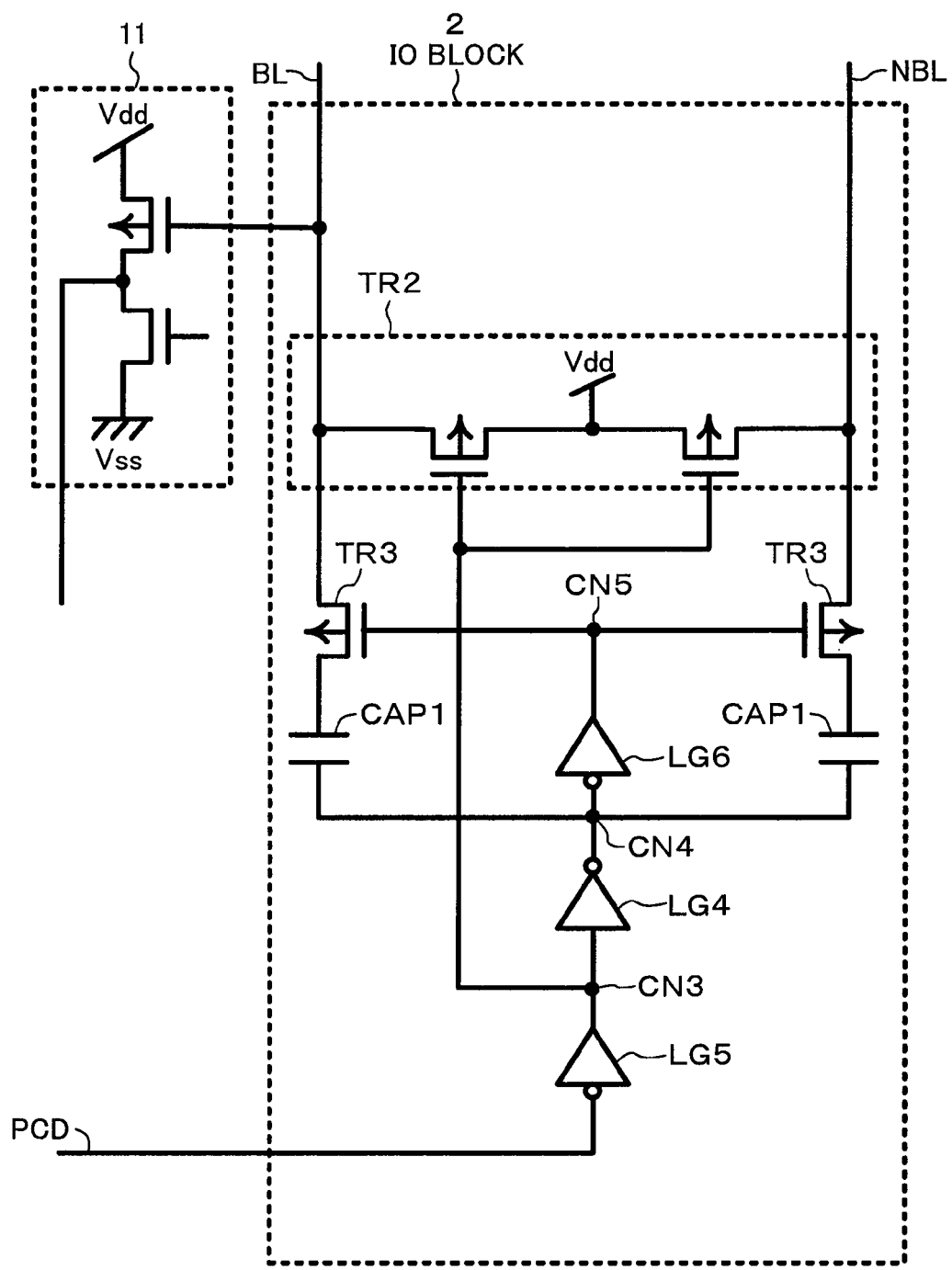
FIG. 14 is a circuit diagram showing the configuration of FIG. 11 in which a data read circuit is connected to only one of two bit lines.

FIGS. 13 and 14 show configurations which include a data read circuit 11 which is connected only to the first bit line BL, in addition to FIGS. 8 and 11, respectively. With this configuration, the first bit line BL can be operated with a small amplitude, resulting in higher-speed operation.

Figure 15:
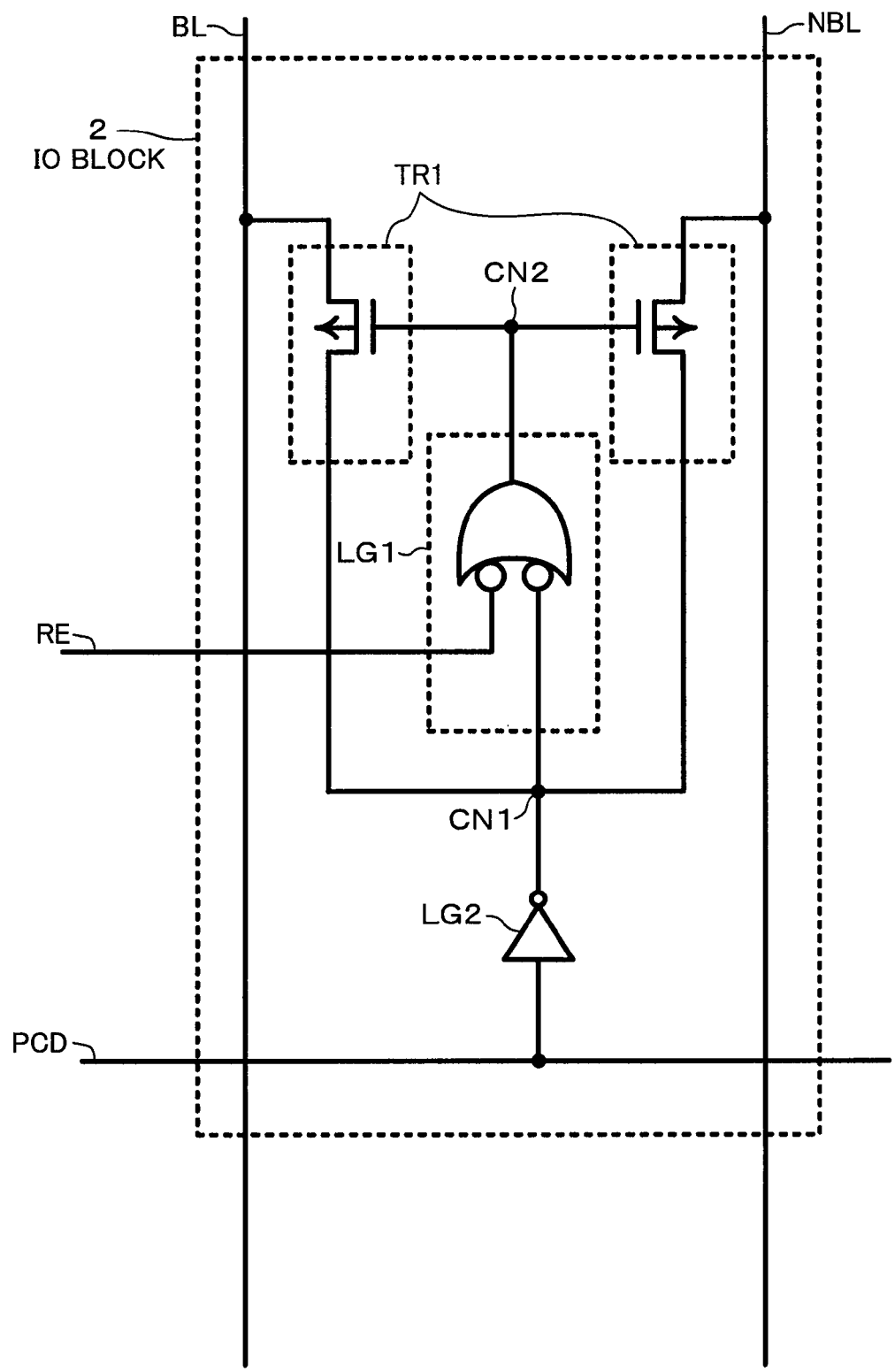
FIG. 15 is a circuit diagram showing a seventh example detailed configuration of the IO block of FIG. 2.
Figure 16:
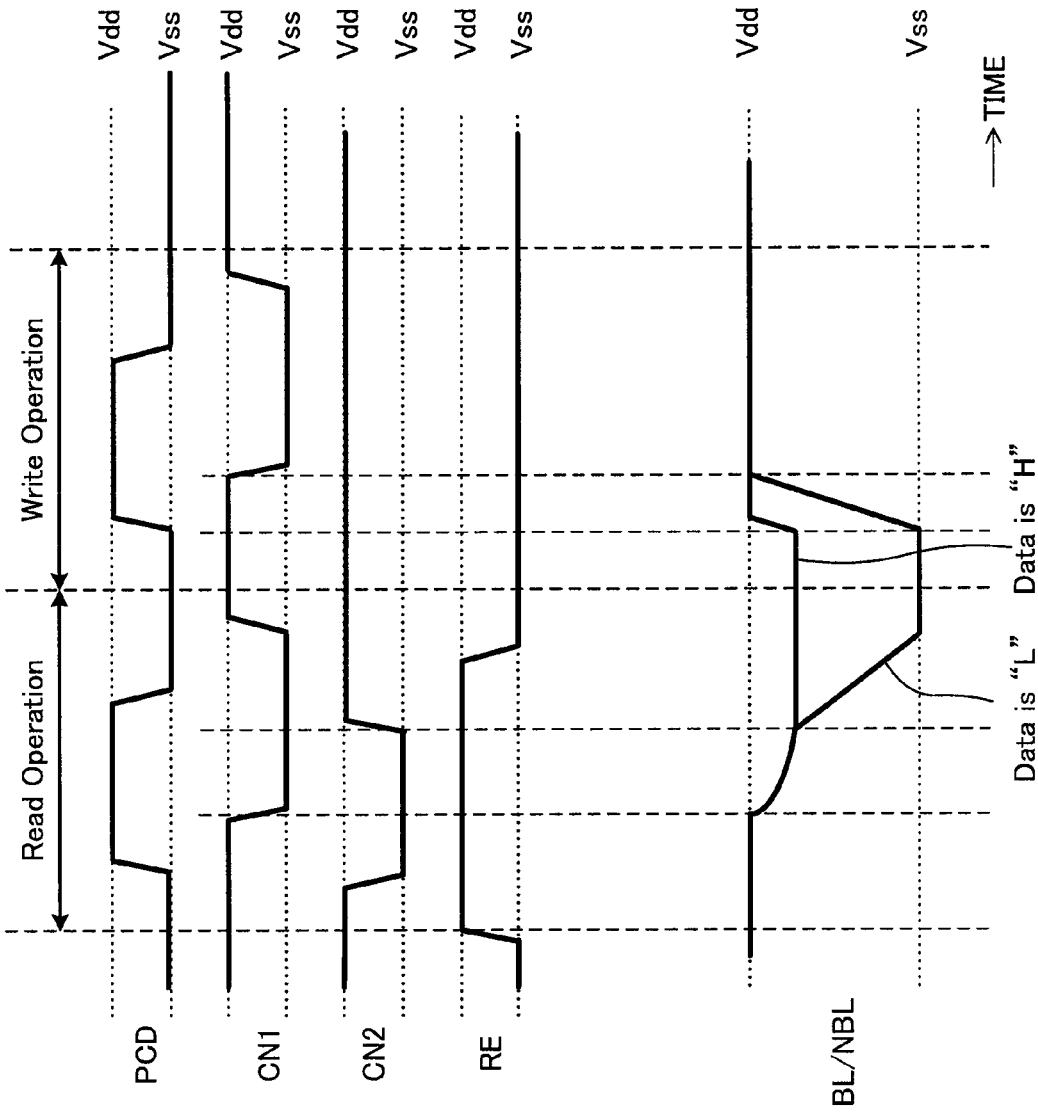
FIG. 16 is a diagram showing timings of FIG. 15.

FIGS. 15 and 16 show a seventh example configuration of the IO block 2 of FIG. 2, and timings thereof, respectively. In FIG. 15, the first logic gate LG1 includes a two-input NAND. A first internal signal RE is connected to one of the inputs of two-input NAND. The first internal signal RE is used to make a decision whether to perform read operation or write operation.

FIG. 16 shows states of the first bit lines BL and NBL in operation modes. During read operation, when the first internal signal RE is at the "H" level, the two-input NAND is equivalent to an inverter and performs the same operation as that of FIGS. 8 and 9. As a result, the potentials of the first bit lines BL and NBL are stepped down for a delay time of the first logic gate LG1.

During write operation, when the first internal signal RE is at the "L" level, the second connect node CN2 is at the "H" level, so that the first transistors TR1 are turned off. As a result, the potentials of the first bit lines BL and NBL are not stepped down, and therefore, remain at the "H" level.

With this configuration, the potentials of the first bit lines BL and NBL are not stepped down during write operation, whereby power for write operation can be reduced.

Figure 17:
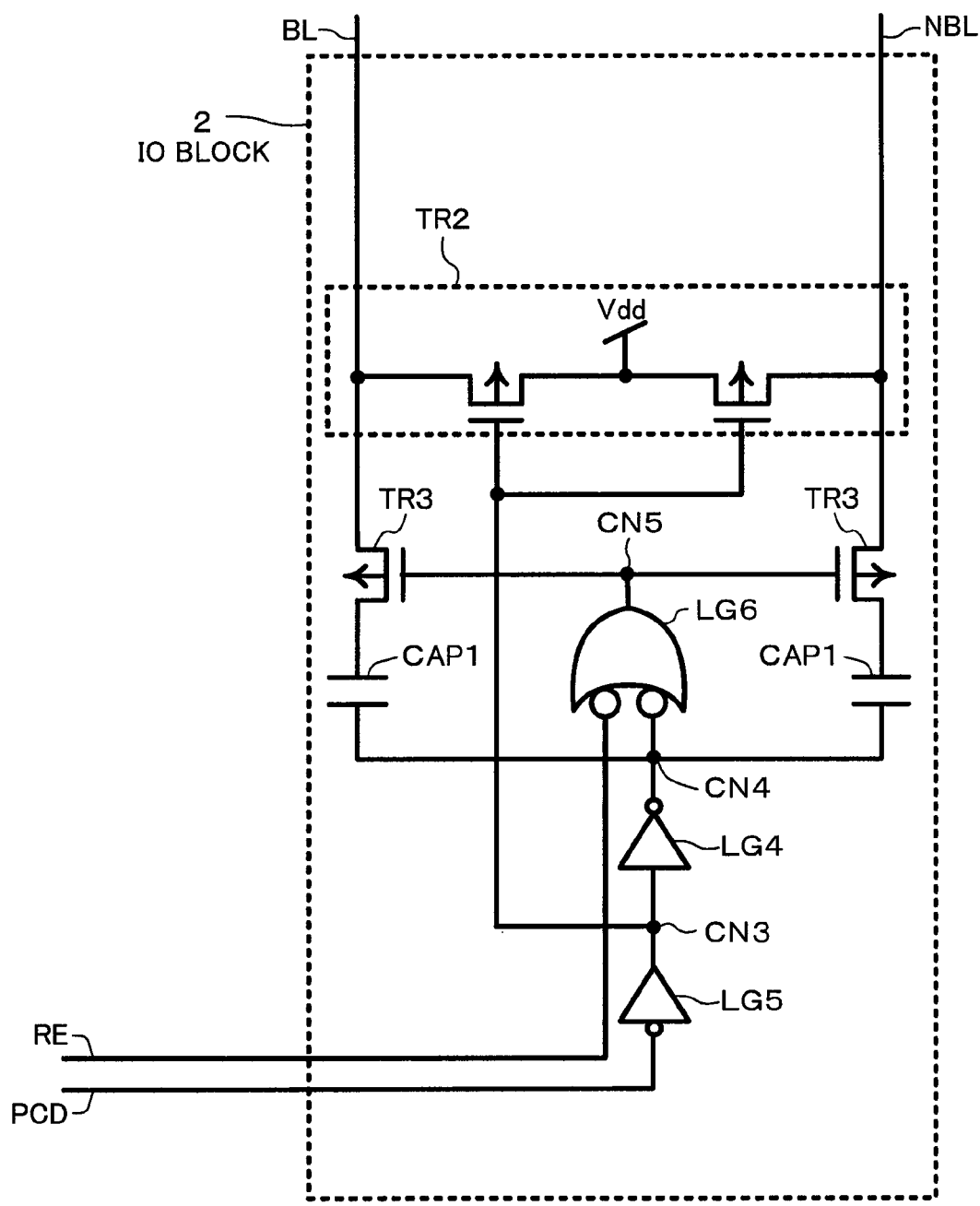
FIG. 17 is a circuit diagram showing an eighth example detailed configuration of the IO block of FIG. 2.
Figure 18:
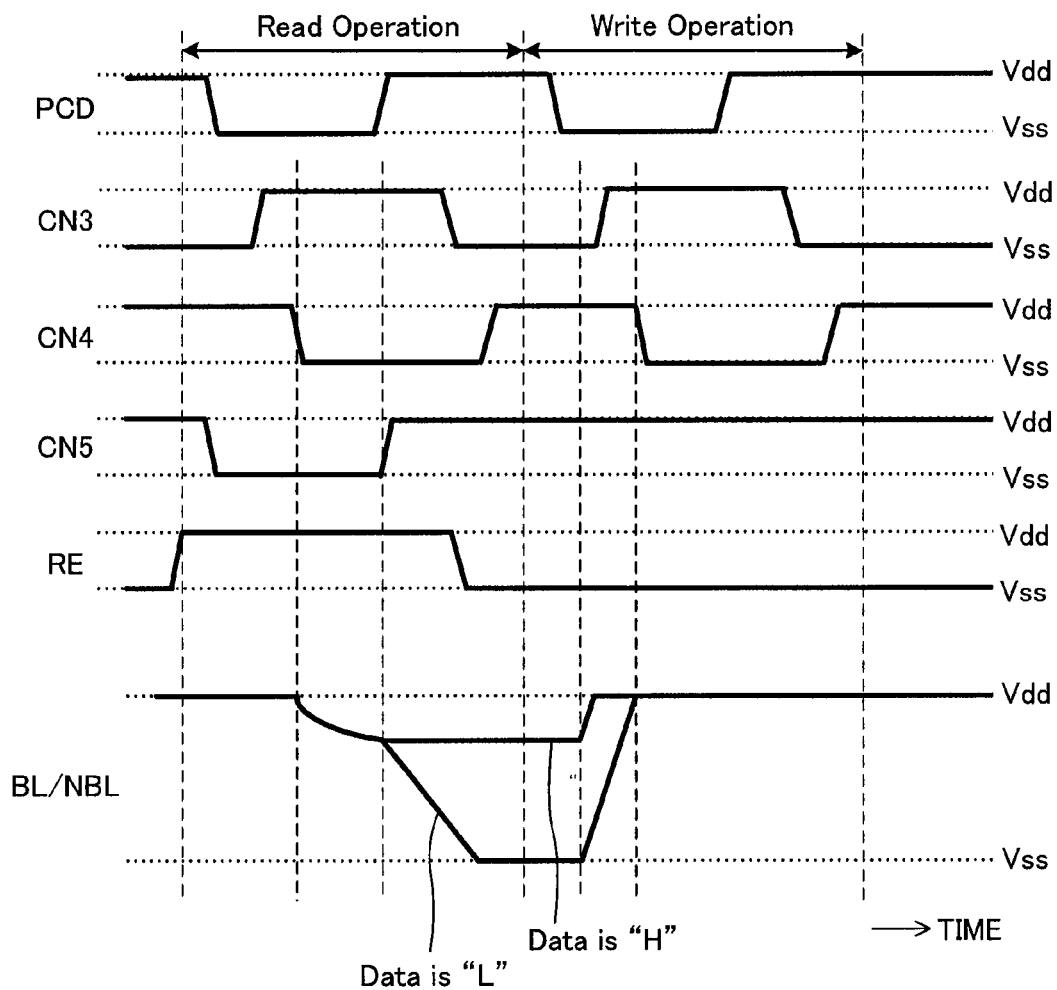
FIG. 18 is a diagram showing timings of FIG. 17.

FIGS. 17 and 18 show an eighth example configuration of the IO block 2 of FIG. 2, and timings thereof, respectively. In FIG. 17, a sixth logic gate LG6 includes a two-input NAND. A first internal signal RE is connected to one of the two inputs of the sixth logic gate LG6. The first internal signal RE is used to make a decision whether to perform read operation or write operation.

FIG. 18 shows states of the first bit lines BL and NBL in operation modes. During read operation, when the first internal signal RE is at the "H" level, the two-input NAND is equivalent to an inverter and performs the same operation as that of FIGS. 11 and 12. As a result, the potentials of the first bit lines BL and NBL are stepped down for a delay time of the sixth logic gate LG6.

During write operation, when the first internal signal RE is at the "L" level, the fifth connect node CN5 is at the "H" level, so that the third transistors TR3 are turned off. As a result, the potentials of the first bit lines BL and NBL are not stepped down, and therefore, remain at the "H" level.

With this configuration, the potentials of the first bit lines BL and NBL are not stepped down during write operation, whereby power for write operation can be reduced.

Figure 19:
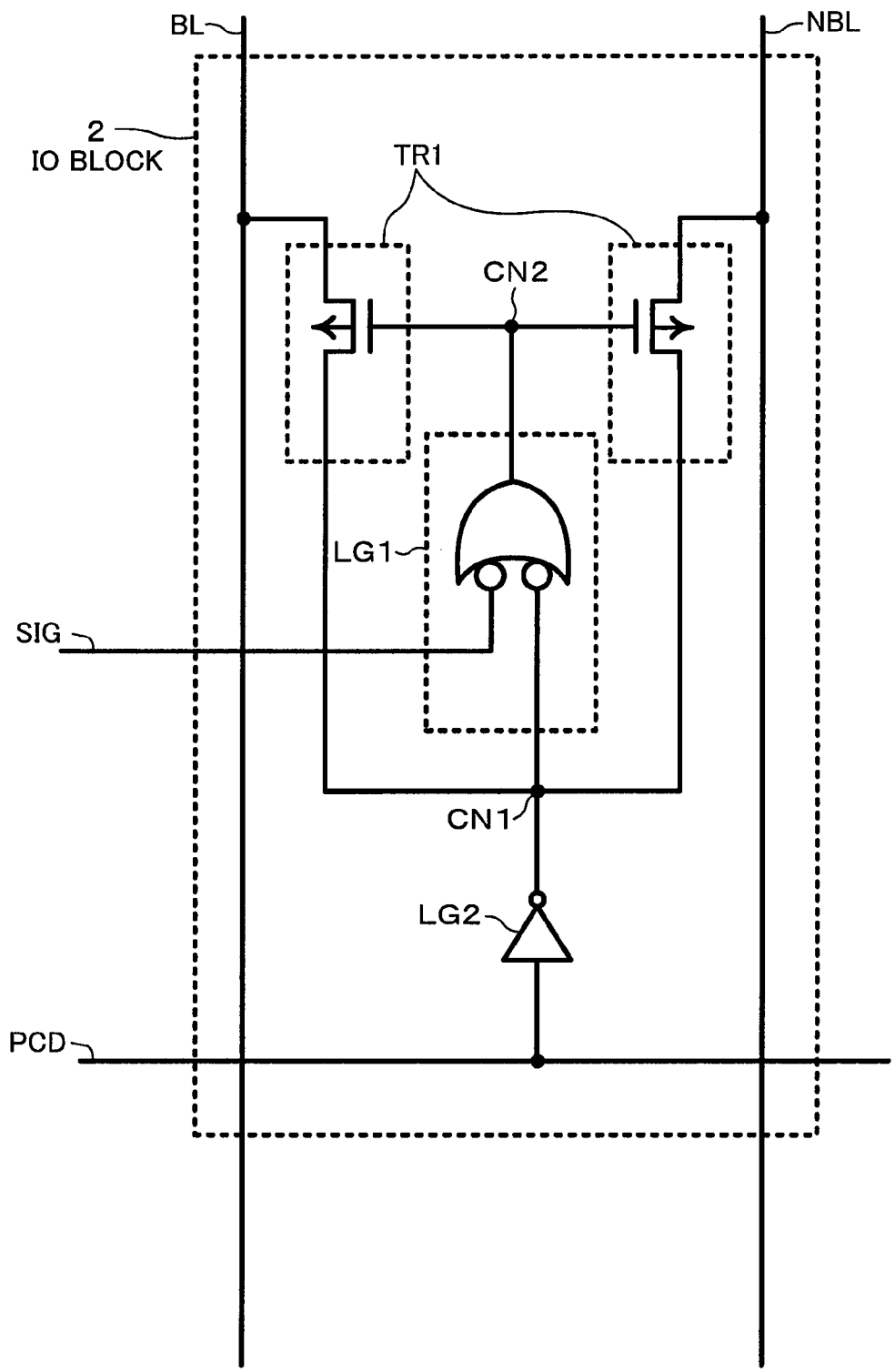
FIG. 19 is a circuit diagram showing a ninth example detailed configuration of the IO block of FIG. 2.
Figure 20:
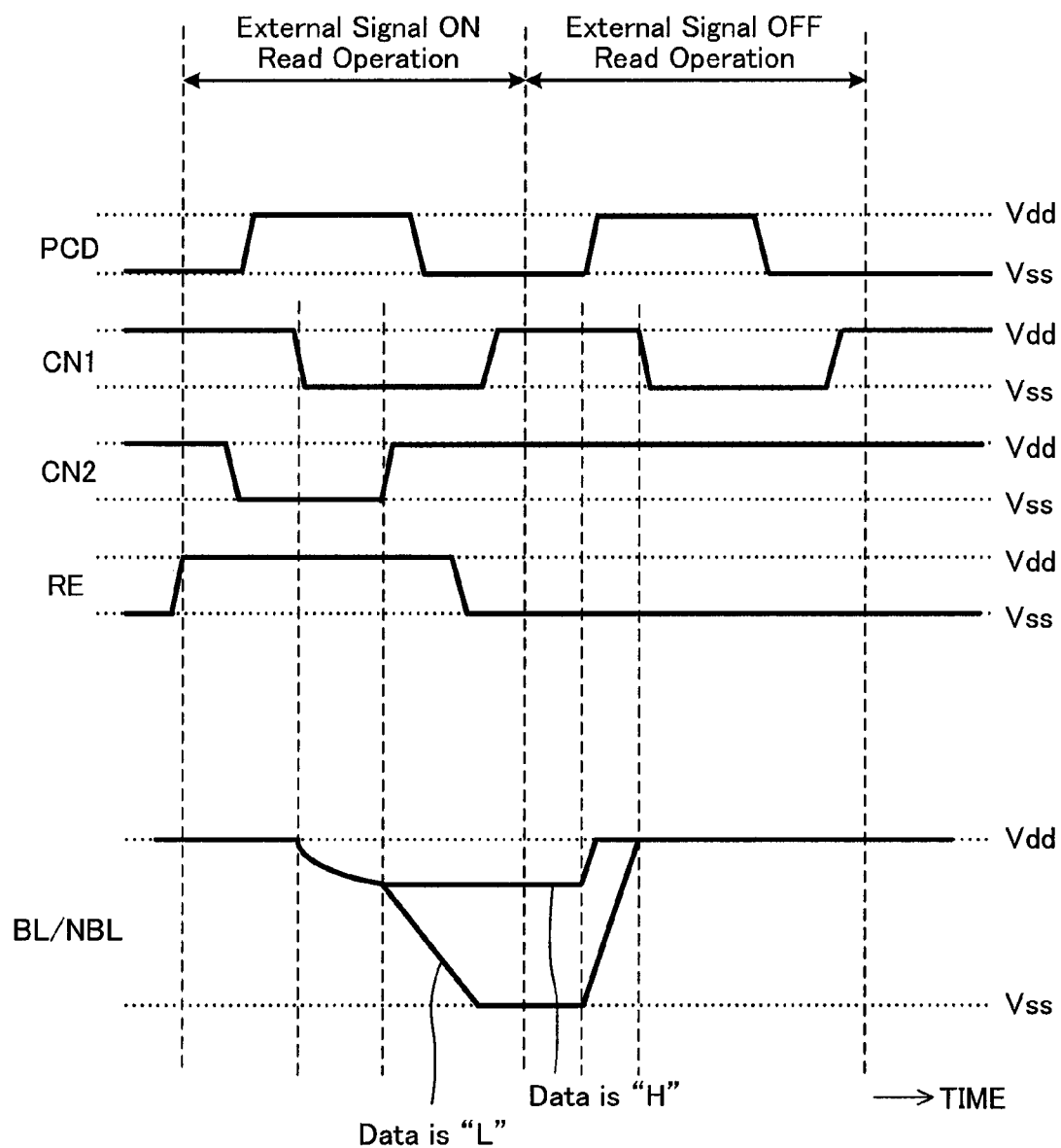
FIG. 20 is a diagram showing timings of FIG. 19.

FIGS. 19 and 20 show a ninth example configuration of the IO block 2 of FIG. 2, and timings thereof, respectively. In FIG. 19, the first logic gate LG1 includes a two-input NAND. A first external signal SIG is connected to one of the two inputs of the first logic gate LG1. The first external signal SIG is used to make a decision whether or not to step down the first bit lines BL and NBL.

FIG. 20 shows states of the first bit lines BL and NBL in potential modes. When the first external signal SIG is at the "H" level (on), the two-input NAND is equivalent to an inverter and performs the same operation as that of FIGS. 8 and 9. As a result, the potentials of the first bit lines BL and NBL are stepped down for a delay time of the first logic gate LG1. When the first external signal SIG is at the "L" level (off), a second connect node CN2 is at the "H" level, so that the first transistors TR1 are turned off. As a result, the potentials of the first bit lines BL and NBL are not stepped down, and remain at the "H" level.

With this configuration, for example, when there is the possibility that stepping down of the first bit lines BL and NBL may lead to erroneous read operation, the erroneous read operation can be reduced or prevented by turning off the first external signal SIG.

Figure 21:
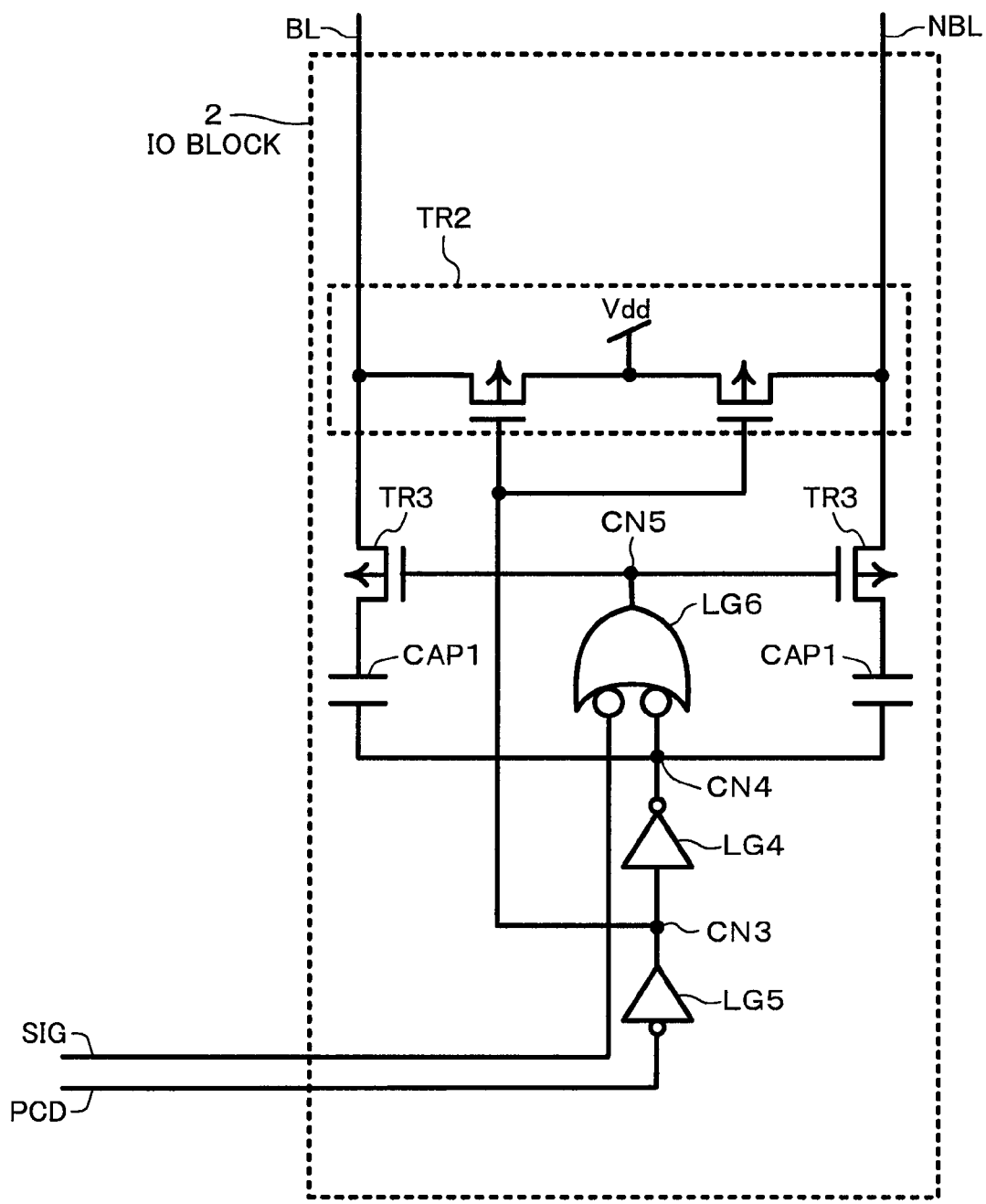
FIG. 21 is a circuit diagram showing a tenth example detailed configuration of the IO block of FIG. 2.
Figure 22:
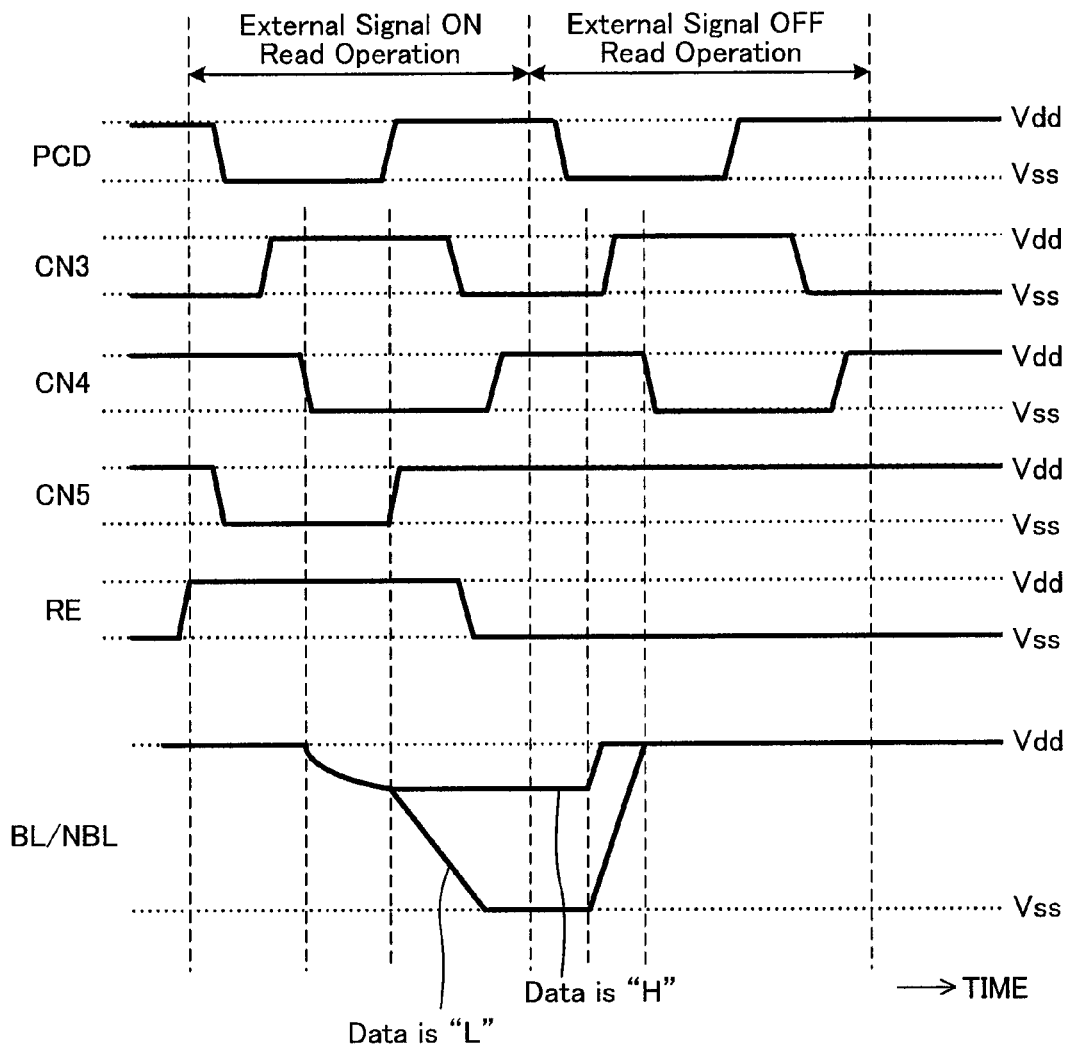
FIG. 22 is a diagram showing timings of FIG. 21.

FIGS. 21 and 22 show a tenth example configuration of the IO block 2 of FIG. 2, and timings thereof, respectively. In FIG. 21, a sixth logic gate LG6 includes a two-input NAND. A first external signal SIG is connected to one of the two inputs of the sixth logic gate LG6. The first external signal SIG is used to make a decision whether or not to step down the first bit lines BL and NBL.

FIG. 22 shows states of the first bit lines BL and NBL in potential modes. When the first external signal SIG is at the "H" level (on), the two-input NAND is equivalent to an inverter and performs the same operation as that of FIGS. 11 and 12. As a result, the potentials of the first bit lines BL and NBL are stepped down for a delay time of the sixth logic gate LG6. When the first external signal SIG is at the "L" level (off), a fifth connect node CN5 is at the "H" level, so that third transistors TR3 are turned off. As a result, the potentials of the first bit lines BL and NBL are not stepped down, and therefore, remain at the "H" level.

With this configuration, for example, when there is the possibility that stepping down of the first bit lines BL and NBL may lead to erroneous read operation, the erroneous read operation can be reduced or prevented by turning off the first external signal SIG.

Figure 23:
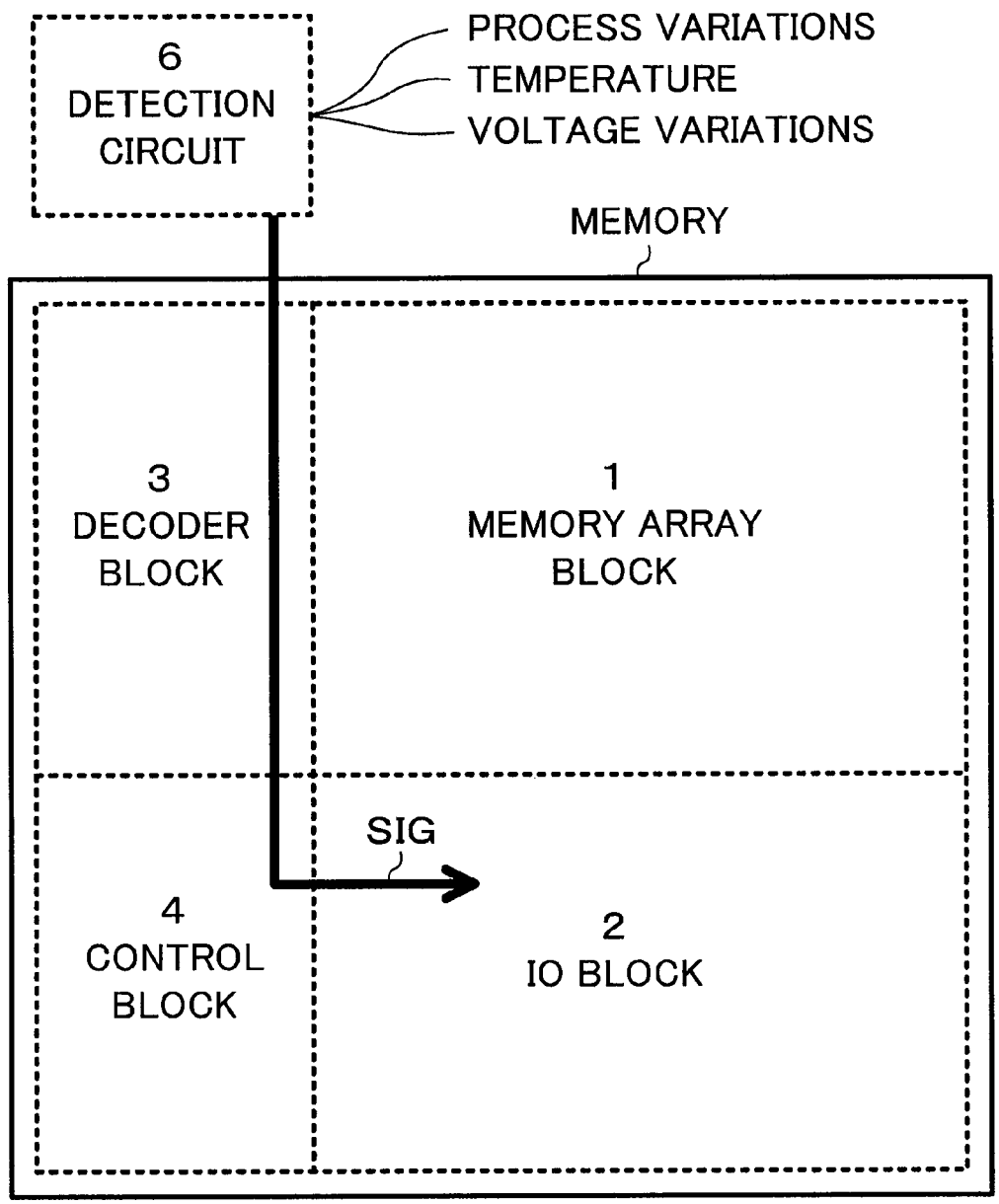
FIG. 23 is a diagram showing the configuration of the SRAM block of FIG. 1 in which a first detection circuit is additionally provided.

FIG. 23 shows the example configuration of the SRAM block of FIG. 1 in which a first detection circuit 6 which is additionally provided. In FIG. 23, the first detection circuit 6 detects process variations, voltage variations, and temperature. A first external signal SIG is an activation signal generated by the first detection circuit 6.

In this configuration, the first detection circuit 6 which detects process variations, voltage variations, and temperature is provided. By inputting the result of the detection as the first external signal SIG to the first logic gate LG1 or the sixth logic gate LG6 of the IO block 2, a decision can be made whether or not to step down the first bit lines BL and NBL. As a result, the first detection circuit 6 detects process variations, voltage variations, and temperature, and when there is the possibility that stepping down of the first bit lines BL and NBL may lead to erroneous read operation, turns off the first external signal SIG.

Figure 24:
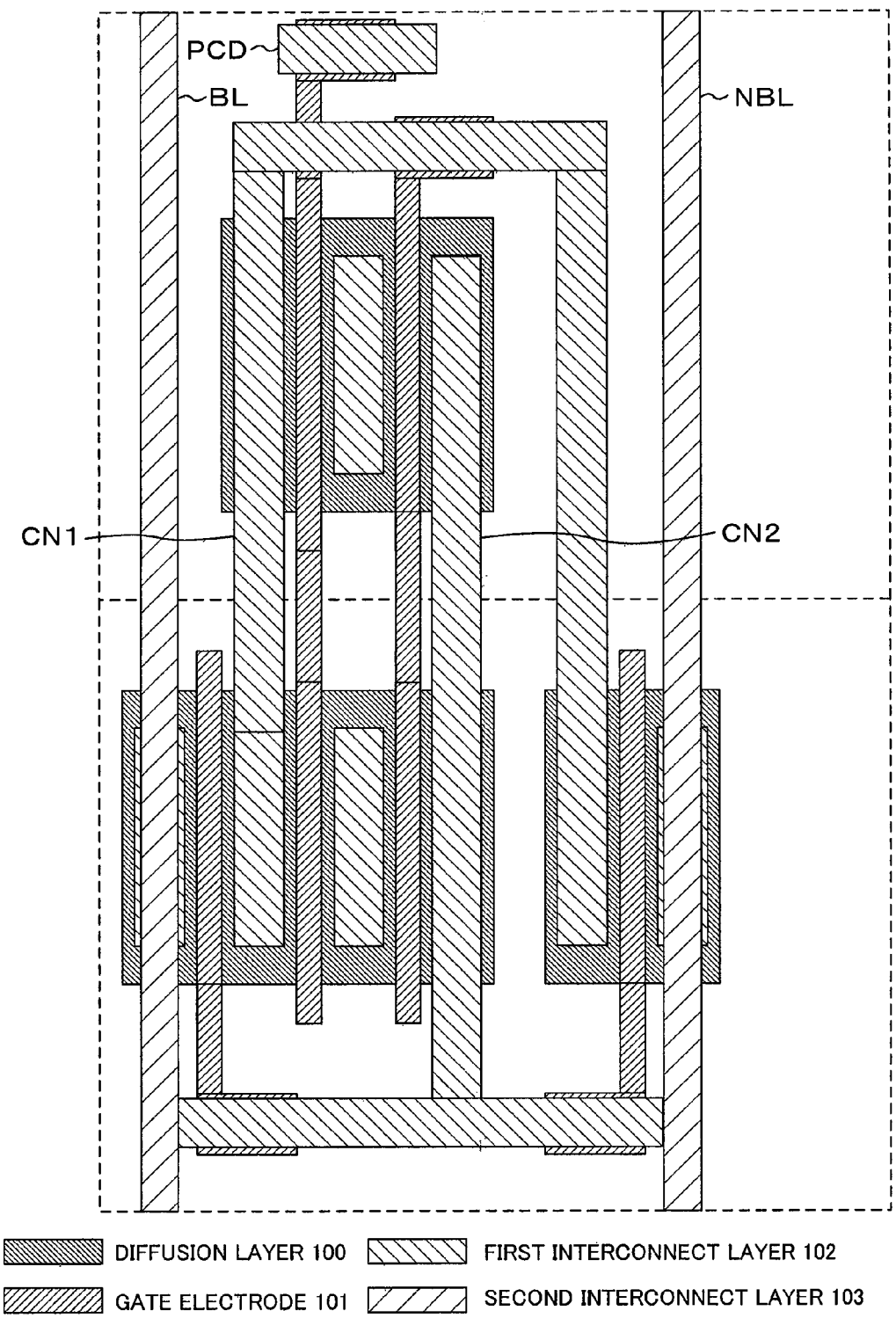
FIG. 24 is a plan view schematically showing a first example layout configuration of a bit line potential control circuit of FIG. 8.

FIG. 24 schematically shows a first example layout configuration of the bit line potential control circuit of FIG. 8. Note that this example configuration does not include the precharge circuit 10. In FIG. 24, the bit line potential control circuit includes a diffusion layer 100, gate electrodes 101, a first interconnect layer 102, and a second interconnect layer 103. In this configuration, the gate electrodes 101 on the diffusion layer 100 are substantially parallel to the first bit lines BL and NBL, whereby the area of the first interconnect layer 102 interposed between the second interconnect layer 103 used in the first bit lines BL and NBL and the diffusion layer 100 used in the first transistors TR1 can be minimized. Therefore, the load capacitance of the first bit lines BL and NBL can be reduced, which contributes to a reduction in the power and an increase in the speed during driving of the first bit lines BL and NBL.

Figure 25:
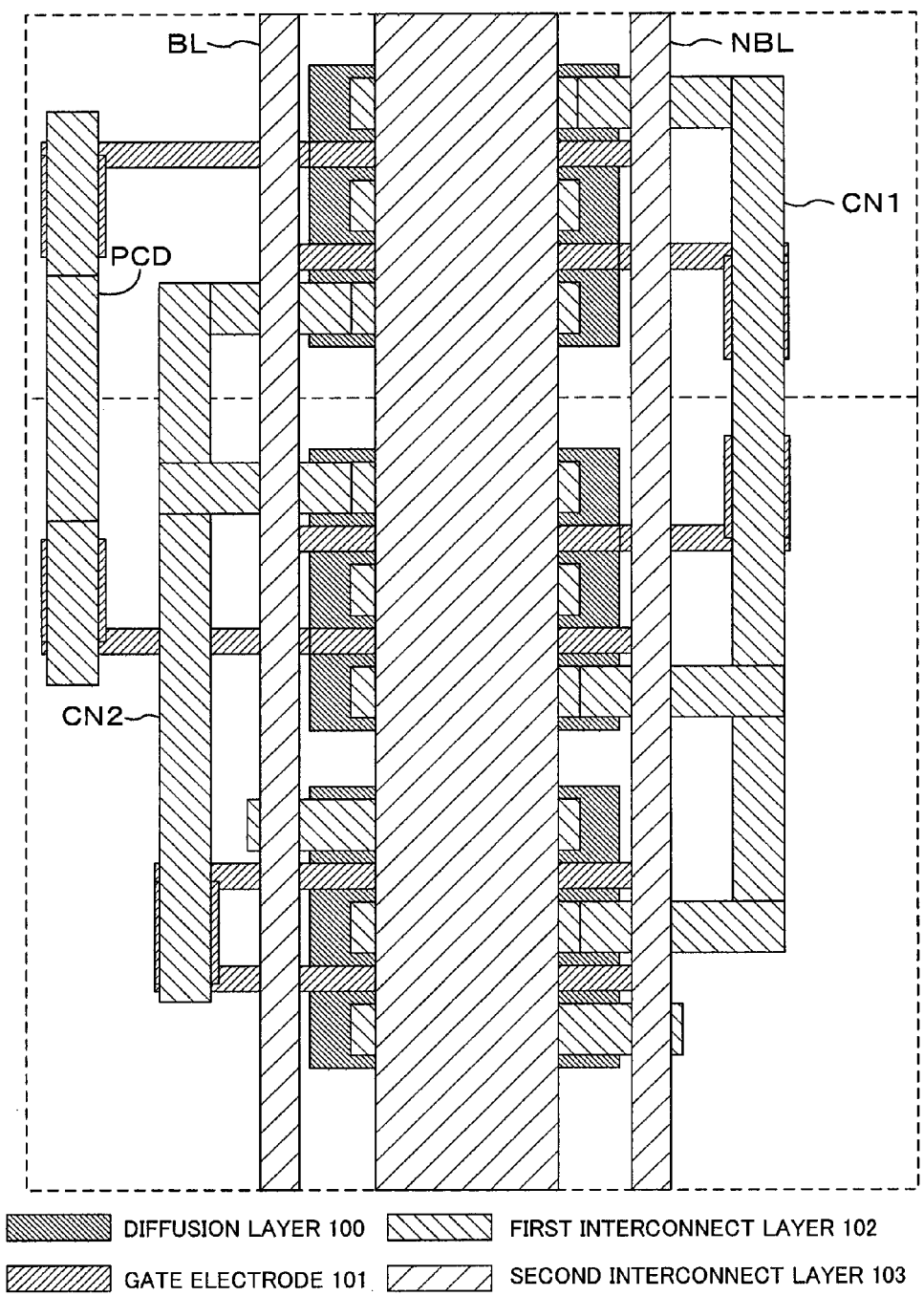
FIG. 25 is a plan view schematically showing a second example layout configuration of the bit line potential control circuit of FIG. 8.
Figure 26:
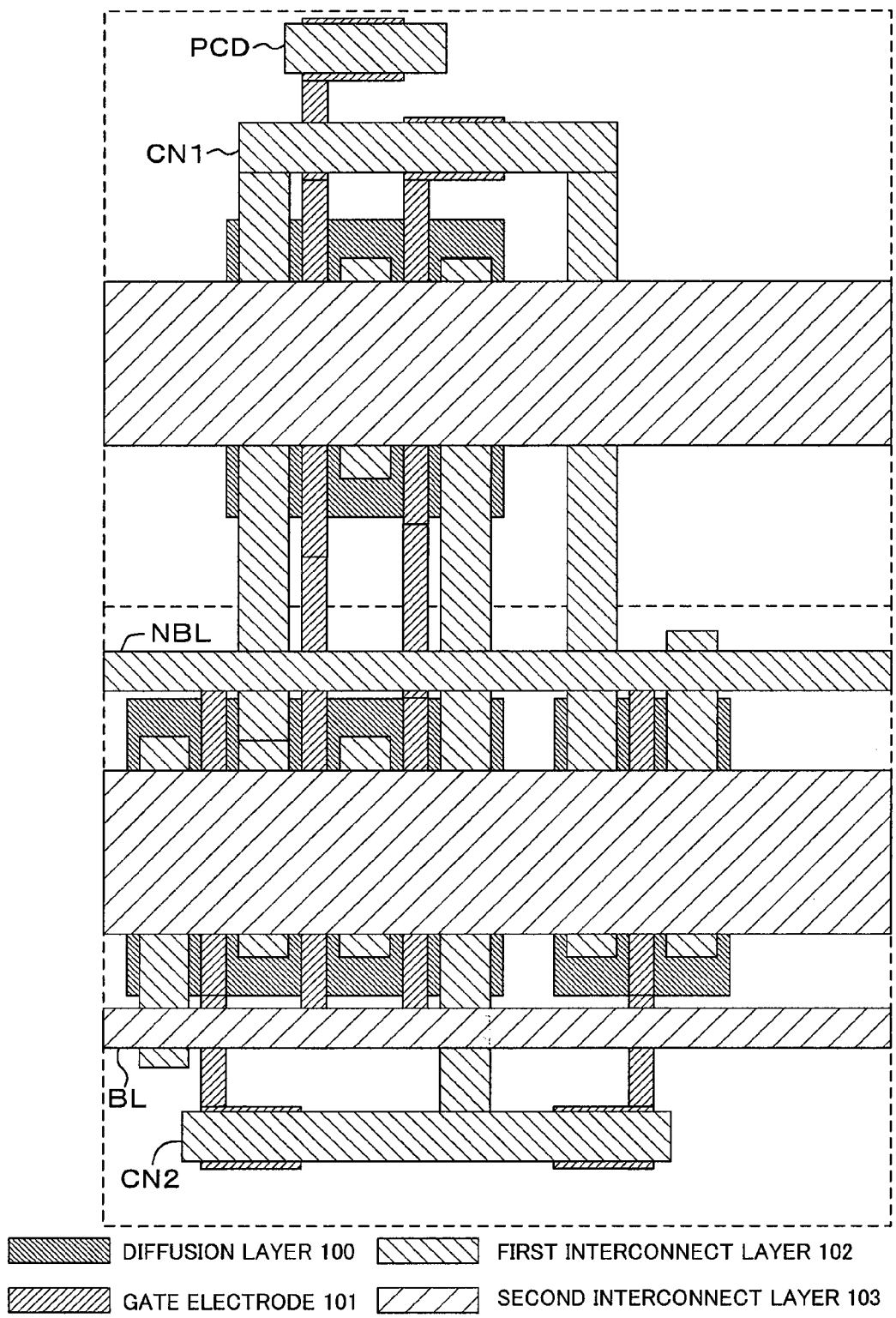
FIG. 26 is a plan view schematically showing a third example layout configuration of the bit line potential control circuit of FIG. 8.

FIGS. 25 and 26 schematically show second and third example layout configurations of the bit line potential control circuit of FIG. 8. Note that, in these configurations, the precharge circuit 10 is not provided. In the configurations, when the gate electrodes on the diffusion layer of the memory cells 5 of FIG. 2 are substantially perpendicular to the first bit lines BL and NBL, gate electrodes 101 on a diffusion layer 100 of FIGS. 25 and 26 are arranged in the same direction as that of the gate electrodes of the memory cells 5. Therefore, an impurity is implanted into the diffusion layer 100 immediately below the gate electrodes 101 in the same direction between the memory array block 1 and the IO block 2, whereby variations caused by impurity implantation can be reduced.

Figure 27:
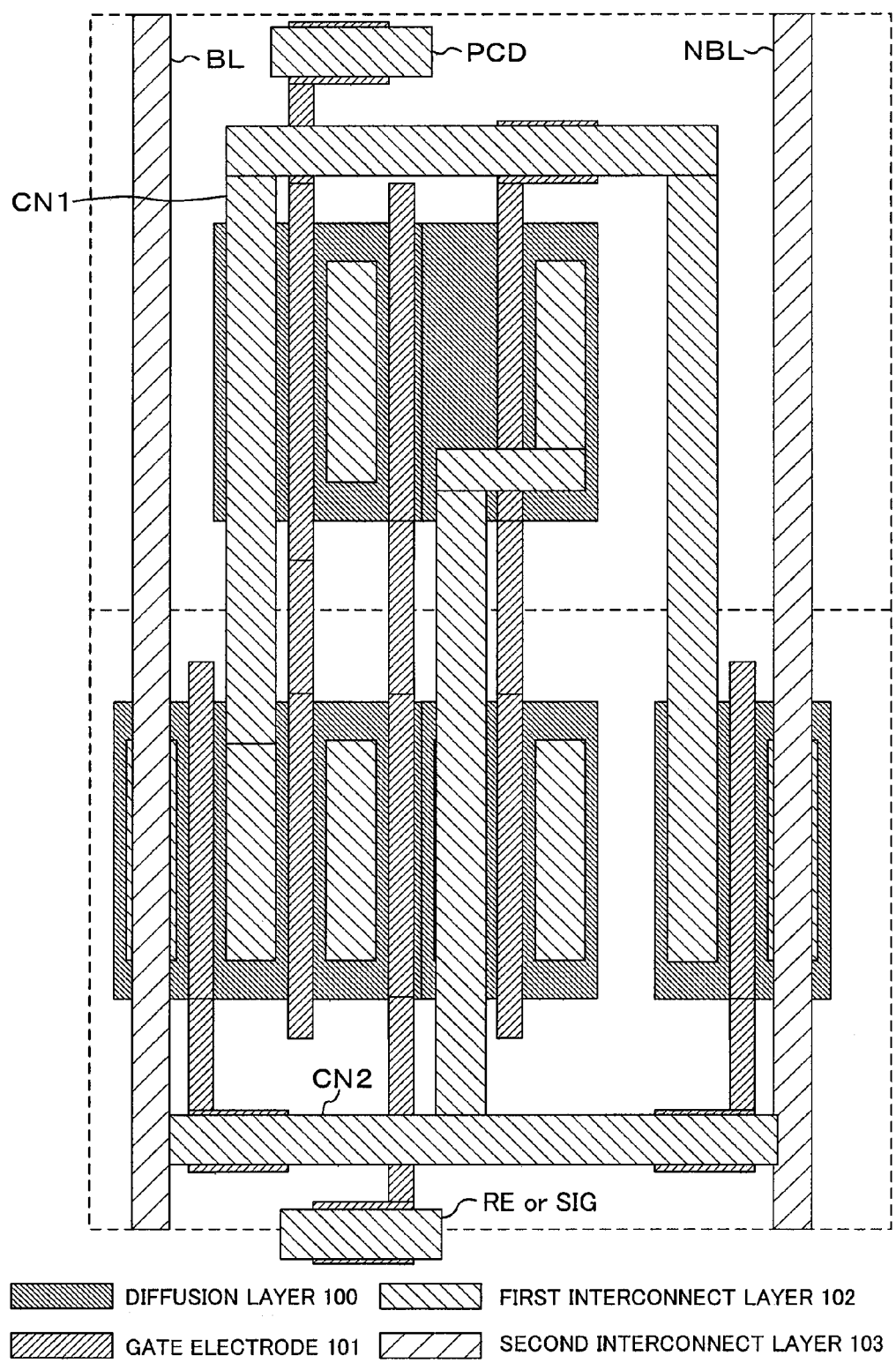
FIG. 27 is a plan view schematically showing a first example layout configuration of bit line potential control circuits of FIGS. 15 and 19.

FIG. 27 schematically shows a first example layer configuration of the bit line potential control circuits of FIGS. 15 and 19. Note that, in this configuration, the precharge circuit 10 is not provided. In the configuration, gate electrodes 101 on a diffusion layer 100 are substantially parallel to the first bit lines BL and NBL, whereby the area of a first interconnect layer 102 interposed between a second interconnect layer 103 used in the first bit lines BL and NBL and the diffusion layer 100 used in the first transistors TR1 can be minimized. Therefore, the load capacitance of the first bit lines BL and NBL can be reduced, which contributes to a reduction in the power and an increase in the speed during driving of the first bit lines BL and NBL.

Figure 28:
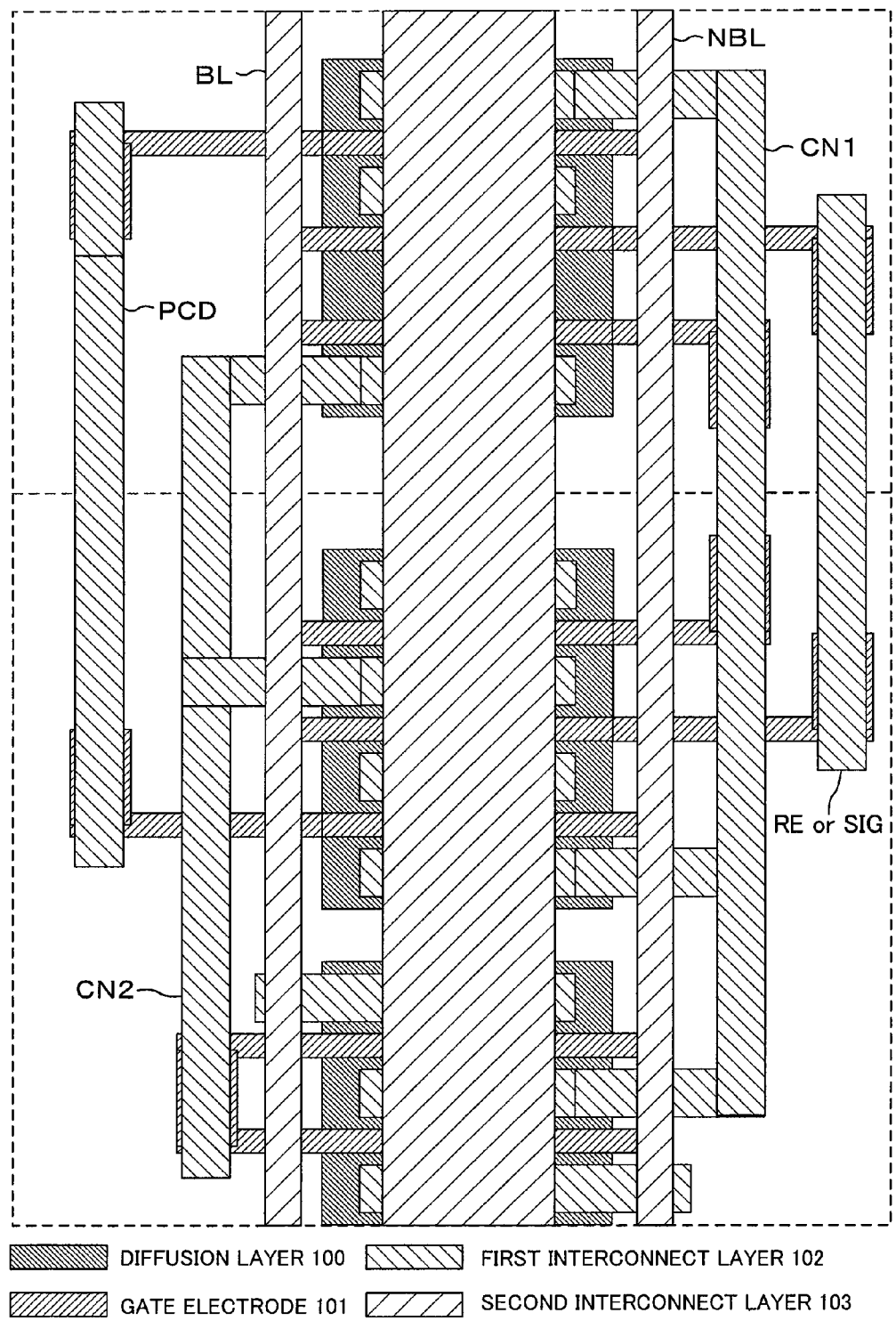
FIG. 28 is a plan view schematically showing a second example layout configuration of the bit line potential control circuits of FIGS. 15 and 19.
Figure 29:
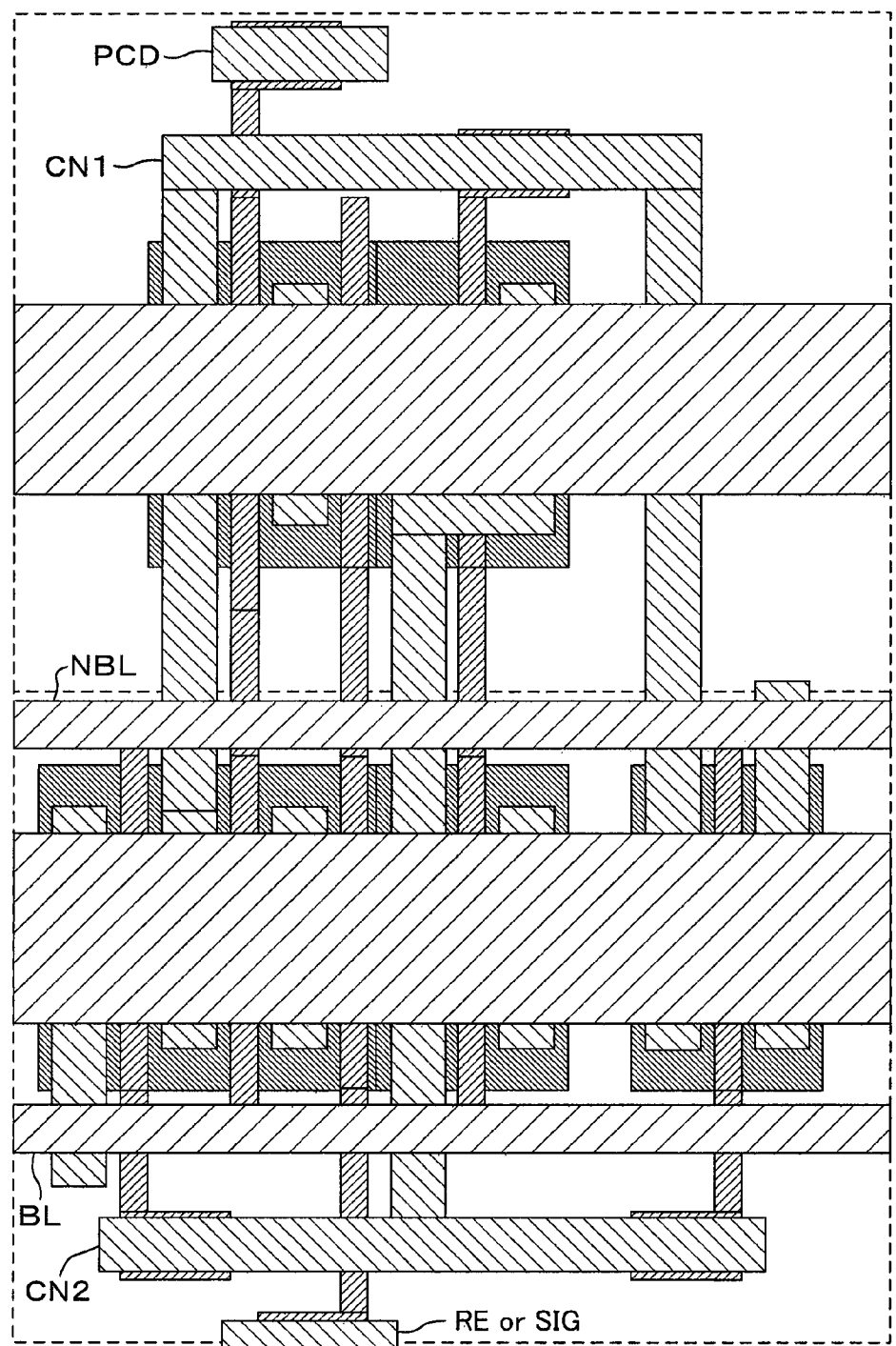
FIG. 29 is a plan view schematically showing a third example layout configuration of the bit line potential control circuits of FIGS. 15 and 19.

FIGS. 28 and 29 schematically show second and third example layer configurations of the bit line potential control circuits of FIGS. 15 and 19, respectively. Note that, in these configurations, the precharge circuit 10 is not provided. In the configurations, when the gate electrodes on the diffusion layer of the memory cells 5 of FIG. 2 are substantially perpendicular to the first bit lines BL and NBL, gate electrodes 101 on a diffusion layer 100 of FIGS. 28 and 29 are arranged in the same direction as that of the gate electrodes of the memory cells 5. Therefore, an impurity is implanted into the diffusion layer 100 immediately below the gate electrodes 101 in the same direction between the memory array block 1 and the IO block 2, whereby variations caused by impurity implantation can be reduced.

Figure 30:
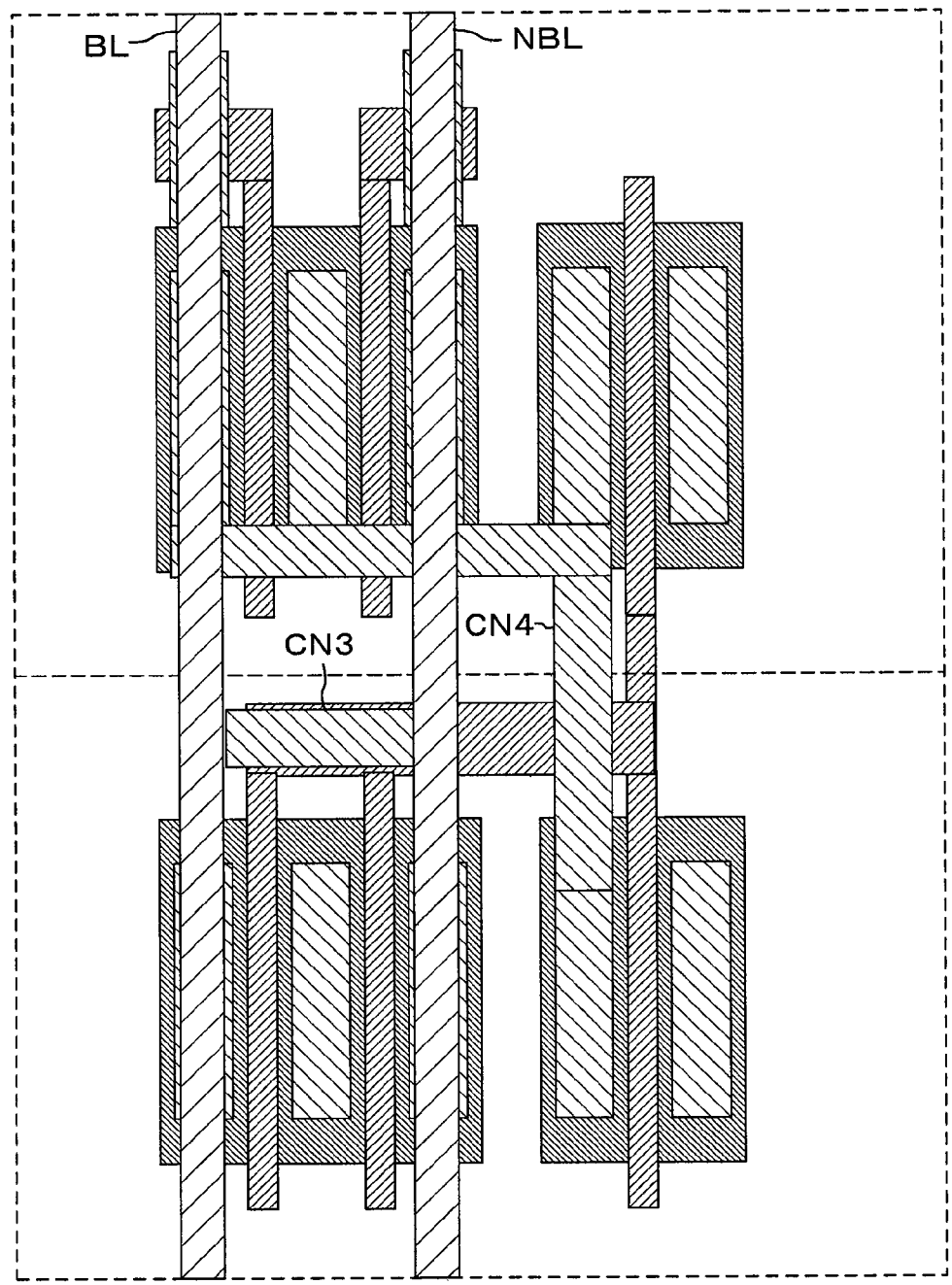
FIG. 30 is a plan view schematically showing a first example layout configuration of a bit line potential control circuit of FIG. 10.

FIG. 30 schematically shows a first example layer configuration of the bit line potential control circuit of FIG. 10. In this configuration, gate electrodes 101 on a diffusion layer 100 are substantially parallel to the first bit lines BL and NBL, whereby the area of a first interconnect layer 102 interposed between a second interconnect layer 103 used in the first bit lines BL and NBL and the diffusion layer 100 used in the second transistors TR2 can be minimized. Therefore, the load capacitance of the first bit lines BL and NBL can be reduced, which contributes to a reduction in the power and an increase in the speed during driving of the first bit lines BL and NBL.

Figure 31:
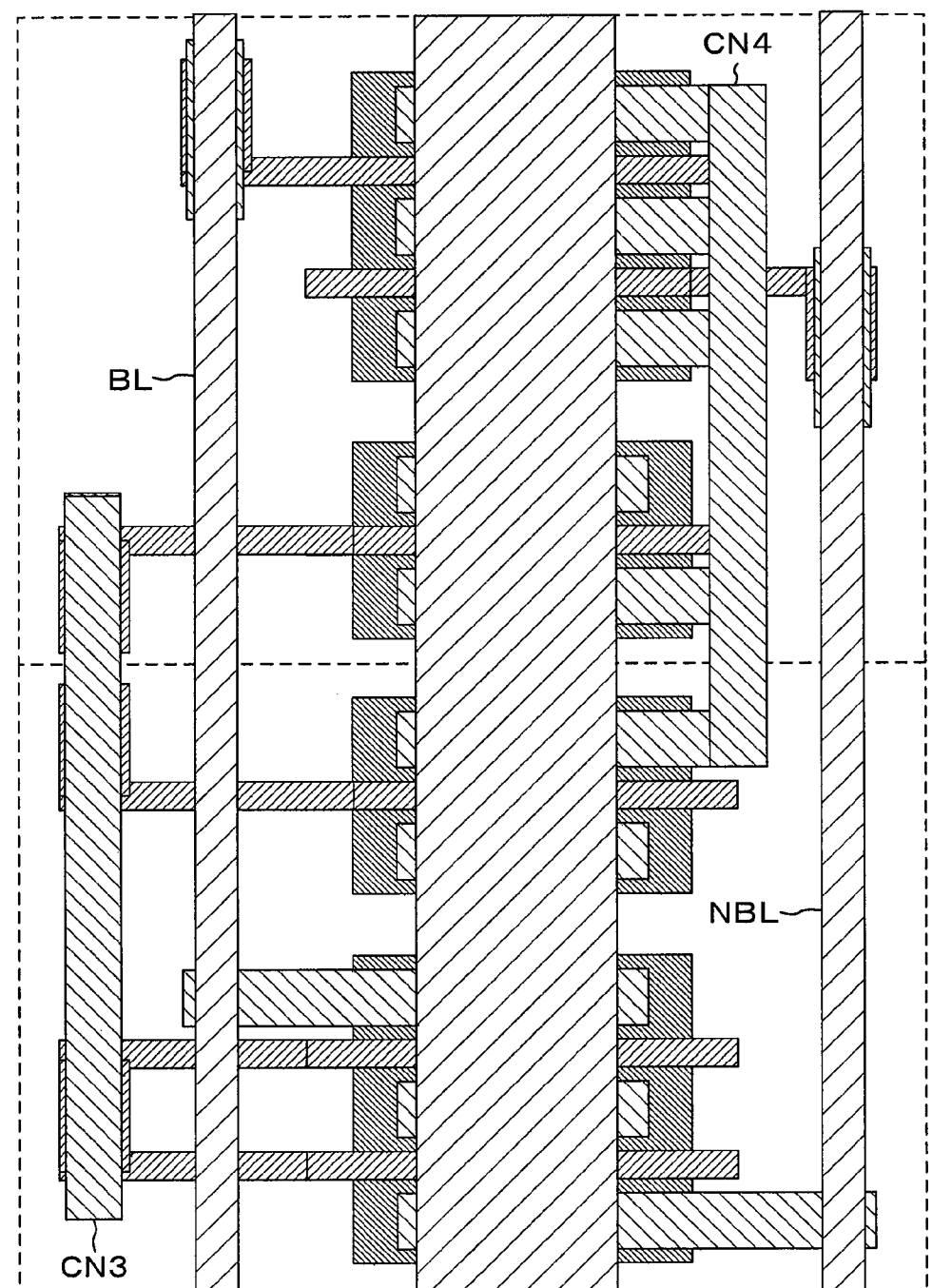
FIG. 31 is a plan view schematically showing a second example layout configuration of the bit line potential control circuit of FIG. 10.

FIG. 31 schematically shows a second example layer configuration of the bit line potential control circuit of FIG. 10. In this configuration, when the gate electrodes on the diffusion layer of the memory cells 5 of FIG. 2 are substantially perpendicular to the first bit lines BL and NBL, gate electrodes 101 on a diffusion layer 100 of FIG. 31 are arranged in the same direction as that of the gate electrodes of the memory cells 5. Therefore, an impurity is implanted into the diffusion layer 100 immediately below the gate electrodes 101 in the same direction between the memory array block 1 and the IO block 2, whereby variations caused by impurity implantation can be reduced.

Figure 32:
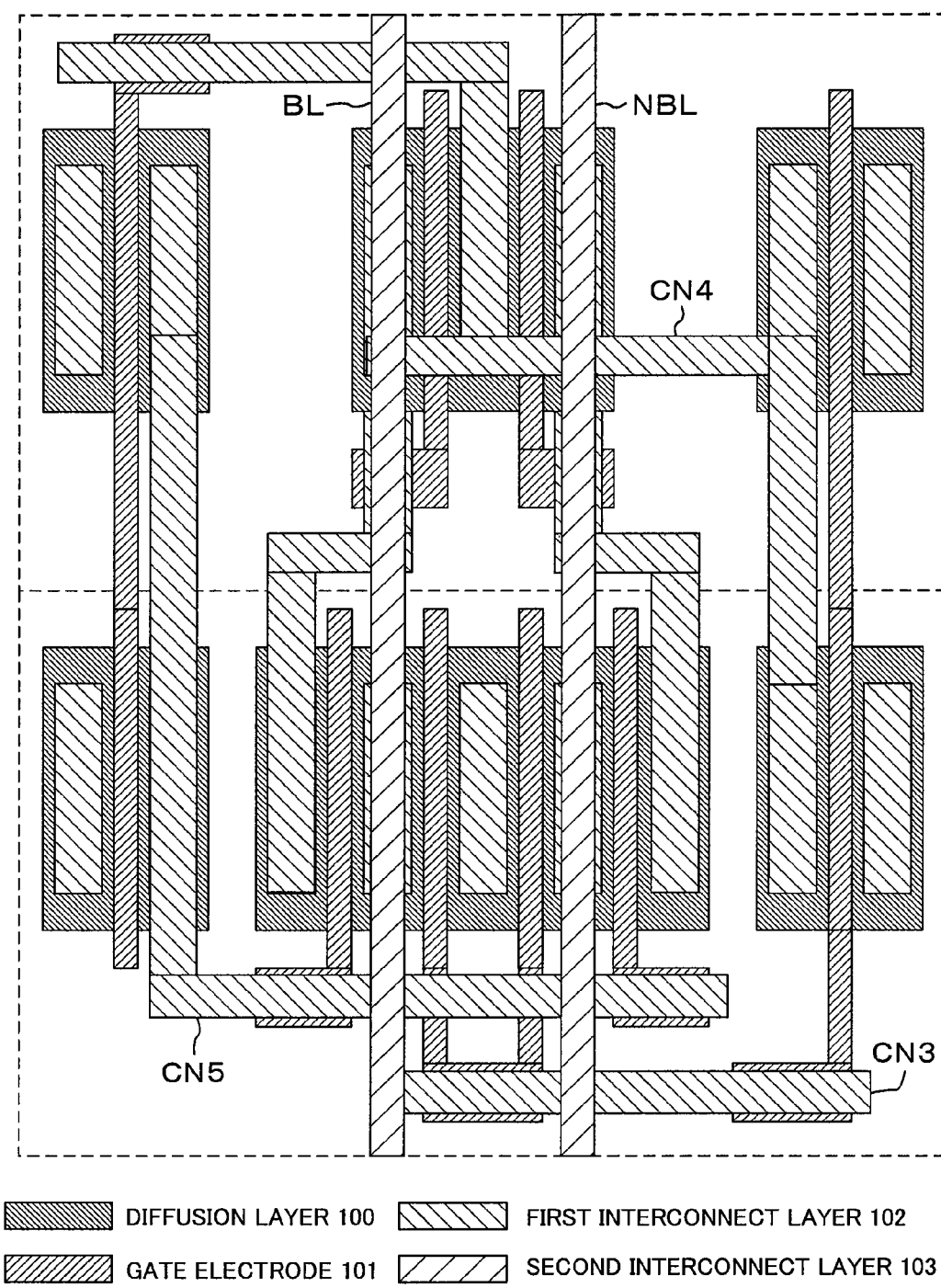
FIG. 32 is a plan view schematically showing a first example layout configuration of a bit line potential control circuit of FIG. 11.

FIG. 32 schematically shows a first example layer configuration of the bit line potential control circuit of FIG. 11. In this configuration, gate electrodes 101 on a diffusion layer 100 are substantially parallel to the first bit lines BL and NBL, whereby the area of a first interconnect layer 102 interposed between a second interconnect layer 103 used in the first bit lines BL and NBL and the diffusion layer 100 used in the second transistors TR2 can be minimized. Therefore, the load capacitance of the first bit lines BL and NBL can be reduced, which contributes to a reduction in the power and an increase in the speed during driving of the first bit lines BL and NBL.

Figure 33:
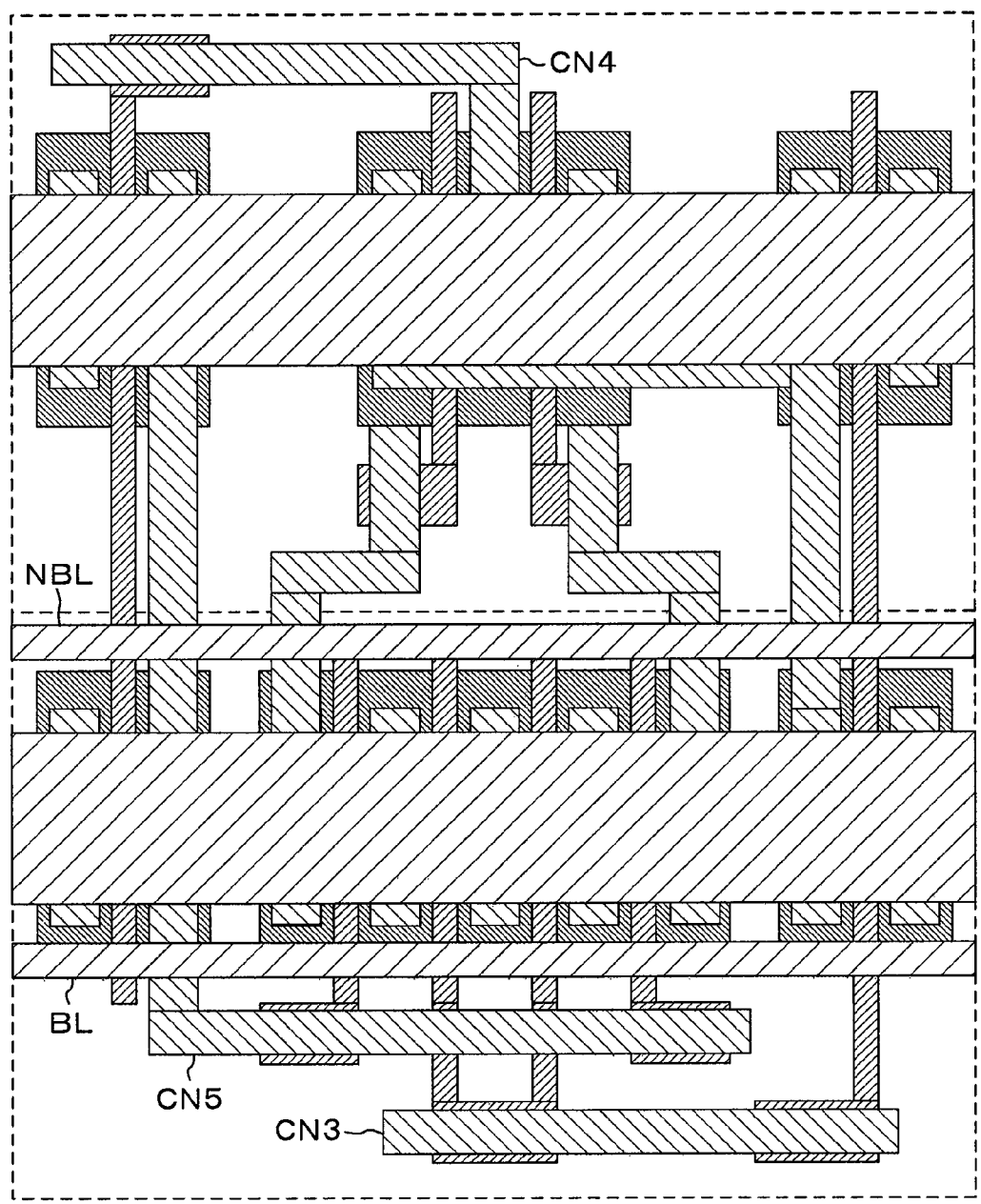
FIG. 33 is a plan view schematically showing a second example layout configuration of the bit line potential control circuit of FIG. 11.

FIG. 33 schematically shows a second example layer configuration of the bit line potential control circuit of FIG. 11. In this configuration, when the gate electrodes on the diffusion layer of the memory cells 5 of FIG. 2 are substantially perpendicular to the first bit lines BL and NBL, gate electrodes 101 on a diffusion layer 100 of FIG. 33 are arranged in the same direction as that of the gate electrodes of the memory cells 5. Therefore, an impurity is implanted into the diffusion layer 100 immediately below the gate electrodes 101 in the same direction between the memory array block 1 and the IO block 2, whereby variations caused by impurity implantation can be reduced.

Figure 34:
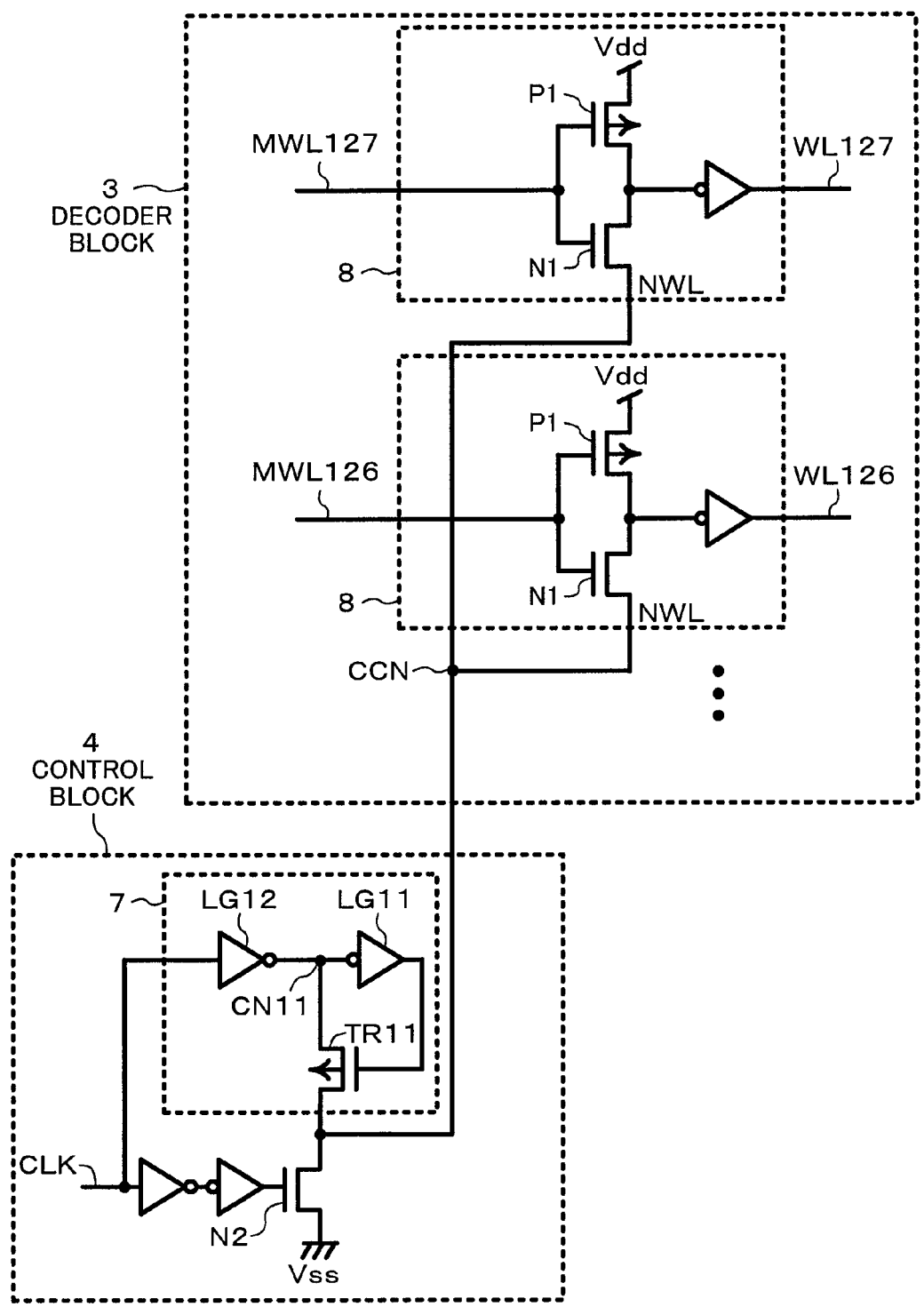
FIG. 34 is a circuit diagram showing details of a decoder block and a control block in the SRAM block of FIG. 1.

FIG. 34 shows details of the decoder block 3 and the control block 4 in the SRAM block of FIG. 1. In FIG. 34, a potential control circuit 7 is connected to source lines of NMOS transistors in the decoder block 3.

Specifically, the decoder block 3 includes a plurality of word drivers 8. MWL 126 and MWL127 are signals input to the word drivers 8, and WL126 and WL127 are signals output from the word drivers 8. The word drivers 8 each include a first PMOS transistor P1 having a source connected to a power supply Vdd, and a first NMOS transistor N1 having a source connected to a first common node CCN.

The control block 4 includes a second NMOS transistor N2 having a drain connected to the first common node CCN, and the potential control circuit 7. The potential control circuit 7 includes a first transistor TR11, a first logic gate LG11, and a second logic gate LG12. The first transistor TR11 controls the potential of the first common node CCN, and the first logic gate LG11 controls the first transistor TR11. A signal is supplied through a first connect node CN11 to the drain or source of the first transistor TR11 and an input of the first logic gate LG11. An output of the first logic gate LG11 is connected to the gate of the first transistor TR11. The second logic gate LG12 which supplies a signal to the first connect node CN11 receives a clock signal CLK.

With the configuration of FIG. 34, higher-speed operation can be performed by previously stepping down the source lines of the word drivers 8, which are long interconnects.

Note that the present disclosure is not limited to the aforementioned embodiments, and various changes and modifications can be made without departing the spirit and scope of the present disclosure. Specifically, the positive and negative logics in the circuits can be changed as appropriate. In addition, although an SRAM is described as an example of the semiconductor memory device in each embodiment, ROMs, other non-volatile memories, and the like may be used. Moreover, the present disclosure is not limited to a one-port memory cell. A multi-port memory call may be used. In this case, a number of bit lines corresponding to the multiple ports are required.

As described above, the semiconductor memory device of the present disclosure can perform stable operation by improving the SNM while reducing or preventing erroneous operation, such as erroneous write operation or the like. Moreover, read operation with a small amplitude is achieved by stepping down the bit line potential, which contributes to higher-speed operation. The present disclosure is particularly useful for memories, such as SRAMs, ROMs, and the like, the increase of the speed of a decoder circuit provided in a memory, a cache memory for a microprocessor, and the like.

What is claimed is:

1. A semiconductor memory device comprising:
a memory array block including a plurality of memory cells arranged in a matrix, a plurality of bit lines including a first bit line provided with respect to a column of the memory cells, and a plurality of word lines including a first word line provided with respect to a row of the memory cells;
an IO block connected to the first bit line;
a decoder block connected to the first word line; and
a control block provided adjacent to both the IO block and the decoder block,
wherein:
the IO block includes a first transistor configured to control a potential of the first bit line, and a first logic gate configured to control the first transistor,
a drain or a source of the first transistor is connected to an input of the first logic gate, and a gate of the first transistor is connected to an output of the first logic gate,
the semiconductor memory device further comprises a second logic gate,
an output of the second logic gate is connected to the input of the first logic gate, and
the second logic gate is provided inside the IO block.

2. A semiconductor memory device comprising:
a memory array block including a plurality of memory cells arranged in a matrix, a plurality of bit lines including a first bit line provided with respect to a column of the memory cells, and a plurality of word lines including a first word line provided with respect to a row of the memory cells;
an IO block connected to the first bit line;
a decoder block connected to the first word line; and
a control block provided adjacent to both the IO block and the decoder block,
wherein:
the IO block includes a first transistor configured to control a potential of the first bit line, and a first logic gate configured to control the first transistor,
a drain or a source of the first transistor is connected to an input of the first logic gate, and a gate of the first transistor is connected to an output of the first logic gate,
the semiconductor memory device further comprises a second logic gate,
an output of the second logic gate is connected to the input of the first logic gate, and
the second logic gate is provided outside the IO block.

3. A semiconductor memory device comprising:
a memory array block including a plurality of memory cells arranged in a matrix, a plurality of bit lines including a first bit line provided with respect to a column of the memory cells, and a plurality of word lines including a first word line provided with respect to a row of the memory cells;
an IO block connected to the first bit line;
a decoder block connected to the first word line; and
a control block provided adjacent to both the IO block and the decoder block,
wherein:
the IO block includes a first transistor configured to control a potential of the first bit line, and a first logic gate configured to control the first transistor,
a drain or a source of the first transistor is connected to an input of the first logic gate, and a gate of the first transistor is connected to an output of the first logic gate,
the semiconductor memory device further comprises a first precharge transistor, and
a source or a drain of the first precharge transistor is connected to the first bit line.

4. The semiconductor memory device of claim 3, further comprising:
a second logic gate,
wherein
an output of the second logic gate is connected to the input of the first logic gate, and
an input of the second logic gate and a gate of the first precharge transistor are connected to each other, and a precharge signal is supplied to the input of the second logic gate and the gate of the first precharge transistor.

5. A semiconductor memory device comprising:
a memory array block including a plurality of memory cells arranged in a matrix, a plurality of bit lines including a first bit line provided with respect to a column of the memory cells and a plurality of word lines including a first word line provided with respect to a row of the memory cells;
an IO block connected to the first bit line;
a decoder block connected to the first word line; and
a control block provided adjacent to both the IO block and the decoder block,
wherein:
the IO block includes a first transistor configured to control a potential of the first bit line, and a first logic gate configured to control the first transistor,
a drain or a source of the first transistor is connected to an input of the first logic gate, and a gate of the first transistor is connected to an output of the first logic gate,
the first bit line includes two bit lines connected to each memory cell, and
the first logic gate is shared by the two bit lines.

6. A semiconductor memory device comprising:
a memory array block including a plurality of memory cells arranged in a matrix, a plurality of bit lines including a first bit line provided with respect to a column of the memory cells, and a plurality of word lines including a first word line provided with respect to a row of the memory cells;
an IO block connected to the first bit line;
a decoder block connected to the first word line; and
a control block provided adjacent to both the 10 block and the decoder block,
wherein:
the IO block includes a first transistor configured to control a potential of the first bit line, and a first logic gate configured to control the first transistor,
a drain or a source of the first transistor is connected to an input of the first logic gate, and a gate of the first transistor is connected to an output of the first logic gate, and
when one of the plurality of memory cells is read out, a single bit line connected to the one of the plurality of memory cells is used as the first bit line.

7. The semiconductor memory device of claim 6, wherein a data read circuit is connected to the single bit line.

8. A semiconductor memory device comprising:
a memory array block including a plurality of memory cells arranged in a matrix, a plurality of bit lines including a first bit line provided with respect to a column of the memory cells, and a plurality of word lines including a first word line provided with respect to a row of the memory cells;
an IO block connected to the first bit line;
a decoder block connected to the first word line; and
a control block provided adjacent to both the IO block and the decoder block,
wherein:
the IO block includes a first transistor configured to control a potential of the first bit line, and a first logic gate configured to control the first transistor,
a drain or a source of the first transistor is connected to an input of the first logic gate, and a gate of the first transistor is connected to an output of the first logic gate,
the first logic gate has at least two inputs,
the semiconductor memory device further comprises a first detection circuit, and
a first input of the first logic gate is the drain or source of the first transistor, and a second input of the first logic gate is an activation signal generated from the first detection circuit.

9. The semiconductor memory device of claim 8, wherein the first detection circuit is configured to detect process variations.

10. The semiconductor memory device of claim 8, wherein the first detection circuit is configured to detect temperature.

11. The semiconductor memory device of claim 8, wherein the first detection circuit is configured to detect voltage variations.

12. A semiconductor memory device comprising:
a memory array block including a plurality of memory cells arranged in a matrix;
a plurality of bit lines including a first bit line provided with respect to a column of the memory cells;
a first transistor configured to control a potential of the first bit line;
a first capacitor including two electrodes, one of the two electrodes being connected to the first bit line; and
a first logic gate configured to control the first capacitor,
wherein
a gate of the first transistor is connected to an input of the first logic gate, and the other electrode of the first capacitor is connected to an output of the first logic gate.

13. A semiconductor memory device comprising:
a memory array block including a plurality of memory cells arranged in a matrix, a plurality of bit lines including a first bit line provided with respect to a column of the memory cells, and a plurality of word lines including a first word line provided with respect to a row of the memory cells;
an IO block connected to the first bit line;
a decoder block connected to the first word line; and
a control block provided adjacent to both the IO block and the decoder block,
wherein
the IO block includes a first transistor configured to control a potential of the first bit line, a first capacitor including two electrodes, one of the two electrodes being connected to the first bit line, and a first logic gate configured to control the first capacitor, and
a gate of the first transistor is connected to an input of the first logic gate, and the other electrode of the first capacitor is connected to an output of the first logic gate.

14. The semiconductor memory device of claim 13, further comprising:
a second logic gate,
wherein
an output of the second logic gate is connected to the input of the first logic gate, and
the second logic gate is provided inside the IO block.

15. The semiconductor memory device of claim 13, further comprising:
a second logic gate,
wherein
an output of the second logic gate is connected to the input of the first logic gate, and
the second logic gate is provided outside the IO block.

16. The semiconductor memory device of claim 13, further comprising:
a second transistor,
wherein
the first capacitor is connected to the first bit line via the second transistor.

17. The semiconductor memory device of claim 13, wherein
the first bit line includes two bit lines connected to each memory cell, and
the first logic gate is shared by the two bit lines.

18. The semiconductor memory device of claim 13, wherein
when one of the plurality of memory cells is read out, a single bit line connected to the one of the plurality of memory cells is used as the first bit line.

19. The semiconductor memory device of claim 18, wherein
a data read circuit is connected to the single bit line.

20. The semiconductor memory device of claim 13, wherein
the first logic gate has at least two inputs.

21. The semiconductor memory device of claim 20, wherein
a first input of the first logic gate is the drain or source of the first transistor, and a second input of the first logic gate is a read control signal.

22. The semiconductor memory device of claim 20, further comprising:
a first detection circuit,
wherein
a first input of the first logic gate is the drain or source of the first transistor, and a second input of the first logic gate is an activation signal generated from the first detection circuit.

23. The semiconductor memory device of claim 22, wherein
the first detection circuit is configured to detect process variations.

24. The semiconductor memory device of claim 22, wherein
the first detection circuit is configured to detect temperature.

25. The semiconductor memory device of claim 22, wherein
the first detection circuit is configured to detect voltage variations.

26. The semiconductor memory device of claim 13, wherein
a gate electrode on a diffusion layer of the first transistor is substantially parallel to the first bit line.

27. The semiconductor memory device of claim 13, wherein
a gate electrode on a diffusion layer of the first transistor is substantially perpendicular to the first bit line.

28. A semiconductor memory device comprising:
a memory array block including a plurality of memory cells arranged in a matrix, a plurality of bit lines including a first bit line provided with respect to a column of the memory cells, and a plurality of word lines including a first word line provided with respect to a row of the memory cells;
an IO block connected to the first bit line;
a decoder block connected to the first word line; and
a control block provided adjacent to both the IO block and the decoder block,
wherein
the decoder block includes a plurality of word drivers each including a first N-channel MOS transistor having a source connected to a first common node,
the control block includes a second N-channel MOS transistor having a drain connected to the first common node, a first transistor configured to control a potential of the first common node, and a first logic gate configured to control the first transistor, and
a drain or a source of the first transistor is connected to an input of the first logic gate, and a gate of the first transistor is connected to an output of the first logic gate.

* * * * *